(12) United States Patent
Dekker et al.

(10) Patent No.: US 10,559,419 B2
(45) Date of Patent: Feb. 11, 2020

(54) INDUCTOR ARRANGEMENT

(71) Applicant: Dialog Semiconductor B.V., s-Hertogenbosch (NL)

(72) Inventors: Thomas Dekker, Hengelo (NL); Mark Oude Alink, Delden (NL)

(73) Assignee: Dialog Semiconductor B.V., 's-Hertogenbosch (NL)

(*) Notice: Subject to any disclaimer, the term of this patent is extended or adjusted under 35 U.S.C. 154(b) by 0 days.

(21) Appl. No.: 15/983,146

(22) Filed: May 18, 2018

(65) Prior Publication Data

US 2019/0355511 A1 Nov. 21, 2019

(51) Int. Cl.
*H01F 27/34* (2006.01)
*H03B 5/12* (2006.01)

(52) U.S. Cl.
CPC ........... *H01F 27/34* (2013.01); *H03B 5/1206* (2013.01)

(58) Field of Classification Search
CPC ...................................................... H01F 27/34
USPC ...................................................... 331/117 R
See application file for complete search history.

(56) References Cited

U.S. PATENT DOCUMENTS 8,884,662 B2 11/2014 Ancis et al.
9,018,987 B1 4/2015 Lahiri
9,679,623 B2 6/2017 Todi et al.
2002/0140516 A1* 10/2002 Dufour ............... H03B 5/1841
  331/167
2006/0214760 A1 9/2006 Menegoli et al.

FOREIGN PATENT DOCUMENTS

WO WO 2016/005537 1/2016

OTHER PUBLICATIONS

"A Tiny Quadrature Oscillator Using Low-Q Series LC Tanks," by Massoud Tohidian et al., IEEE Microwave and Wireless Components Letters, vol. 25, No. 8, Aug. 2015, pp. 520-522.
Mitigating Oscillator Pulling Due to Magnetic Coupling in Monolithic Mixed-Signal Radio-Frequency Integrated Circuits, A Master of Science Thesis, by Ian David Sobering, Kansas State University, Department of Electrical and Computer Engineering, Manhattan, Kansas, 2014, 103 pgs.

* cited by examiner

*Primary Examiner* — Joseph Chang
(74) *Attorney, Agent, or Firm* — Saile Ackerman LLC; Stephen B. Ackerman

(57) ABSTRACT

An inductor arrangement has a first inductor structure having one or more inductors at least partially on a first layer and a second inductor structure having one or more inductors at least partially on a second layer. The inductors are arranged such that currents induced by an external magnetic field are substantially cancelled in at least one of the first inductor structure and the second inductor structure. The, or each, inductor of the second inductor structure overlaps, at least partially, the, or each, inductor of the first inductor structure. An oscillator circuit having an inductor arrangement is also presented.

21 Claims, 15 Drawing Sheets

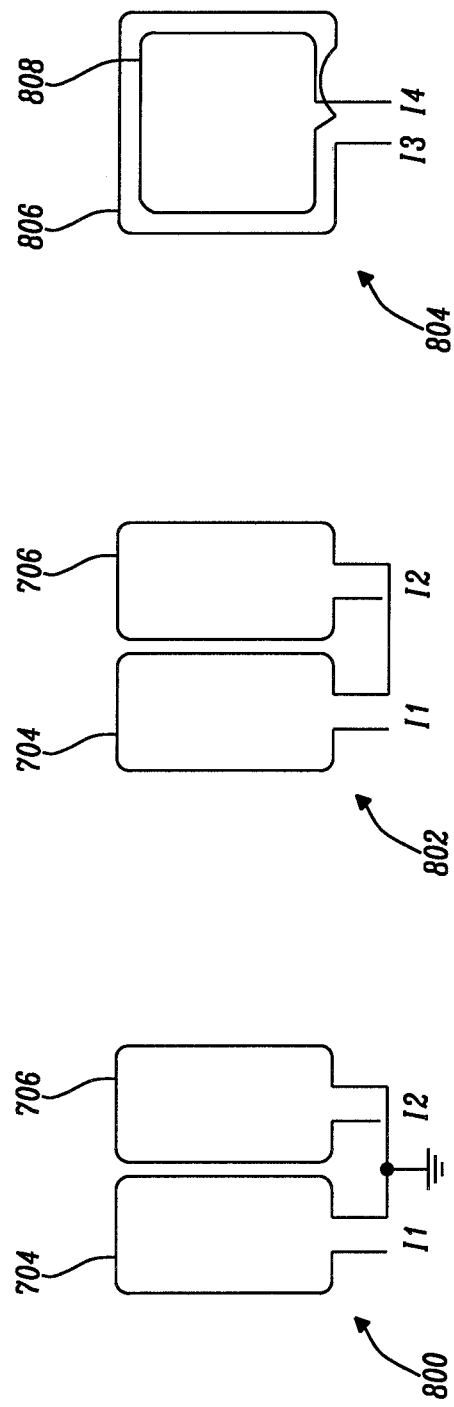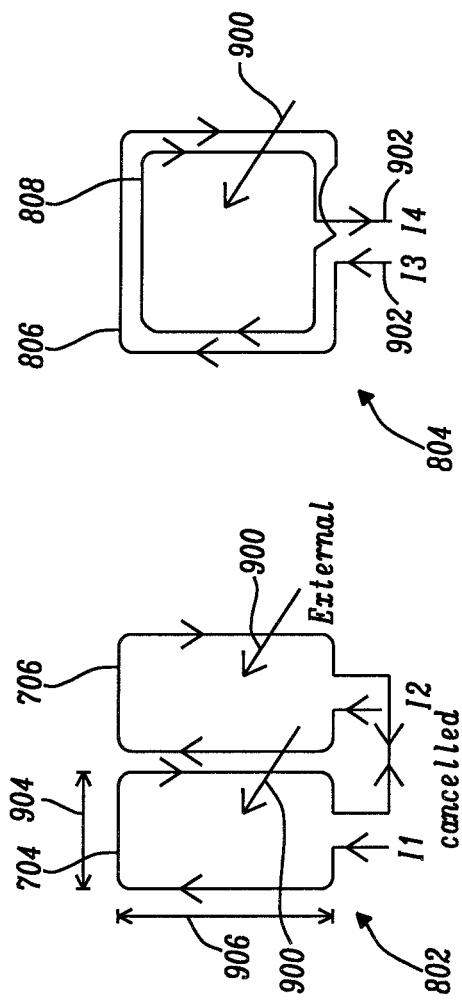

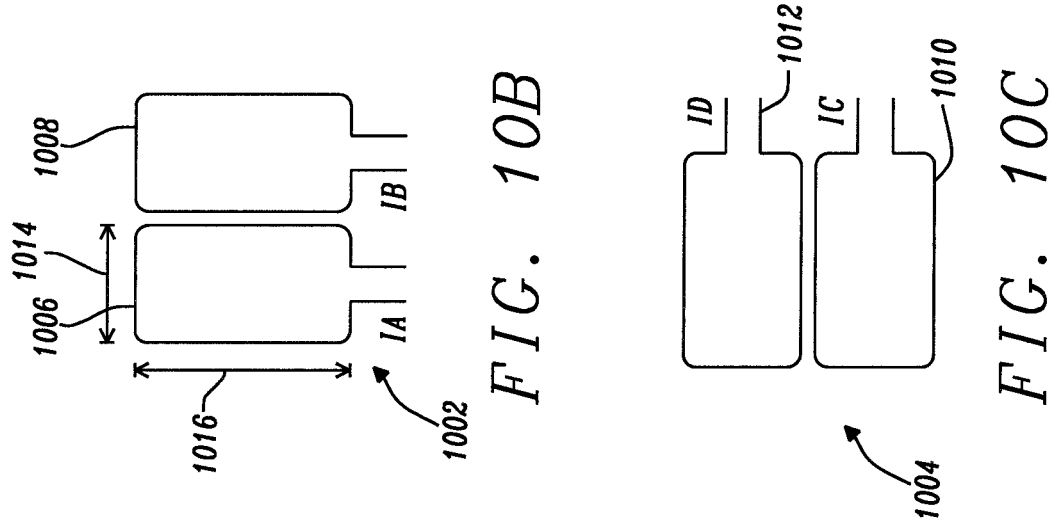
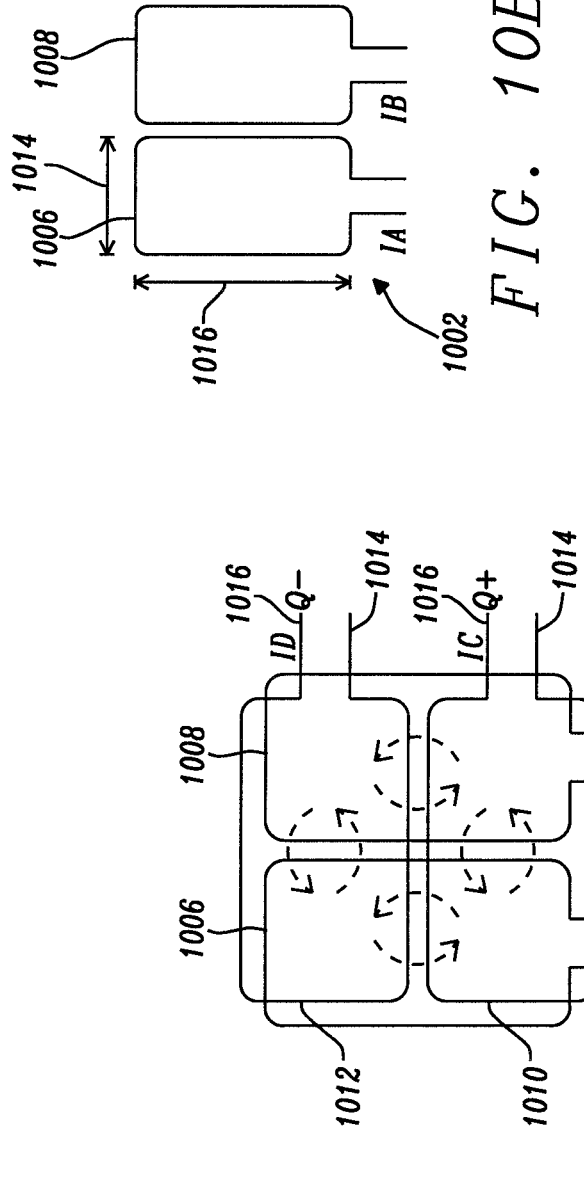

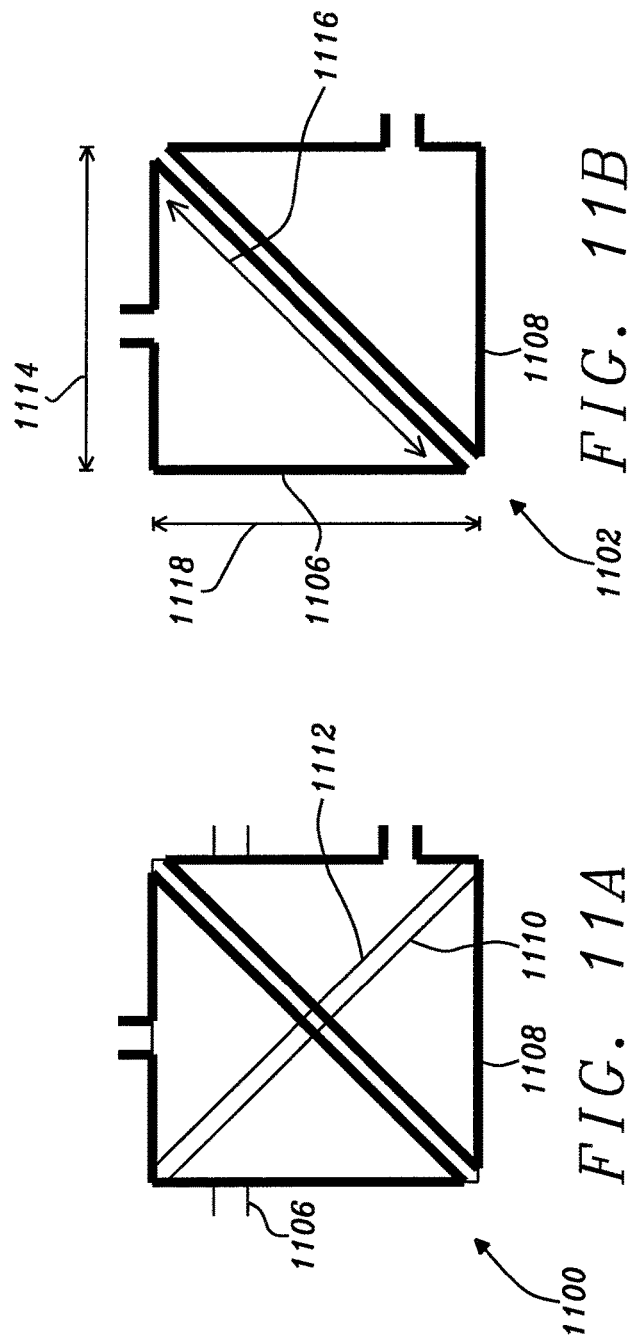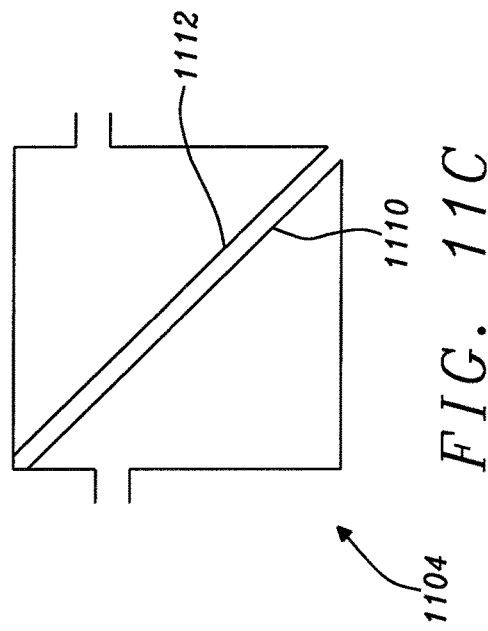

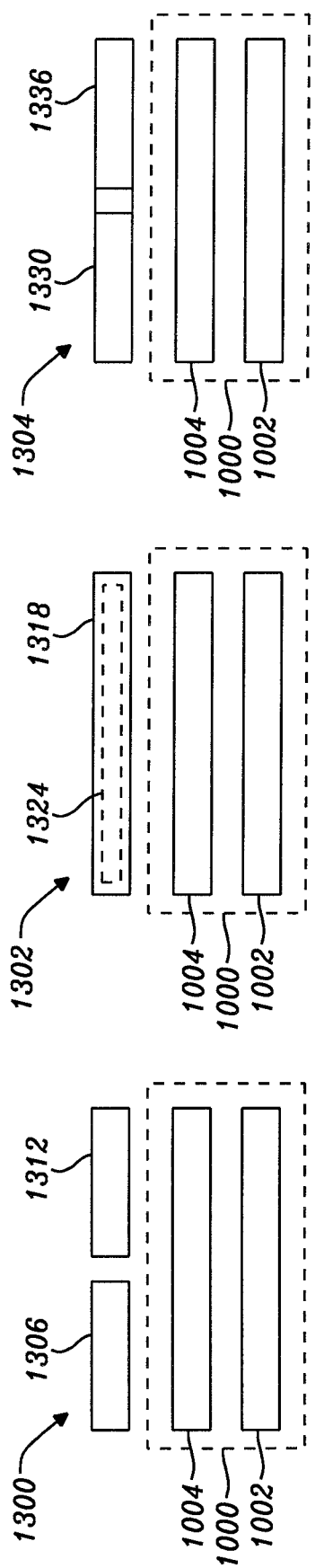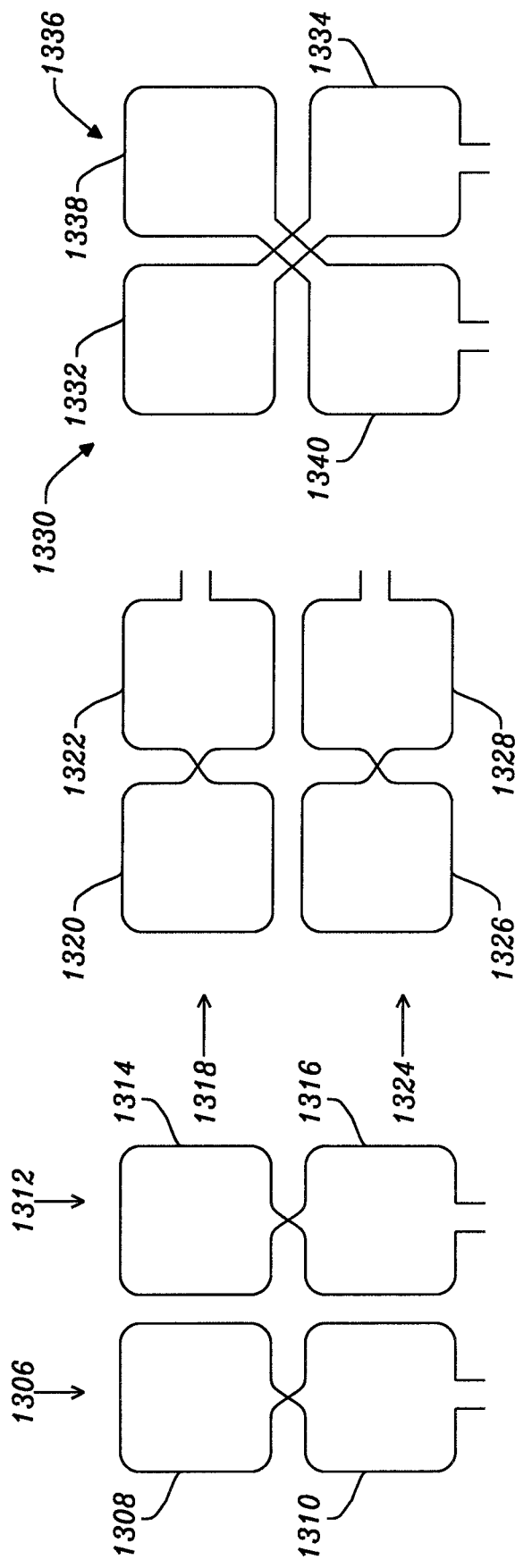

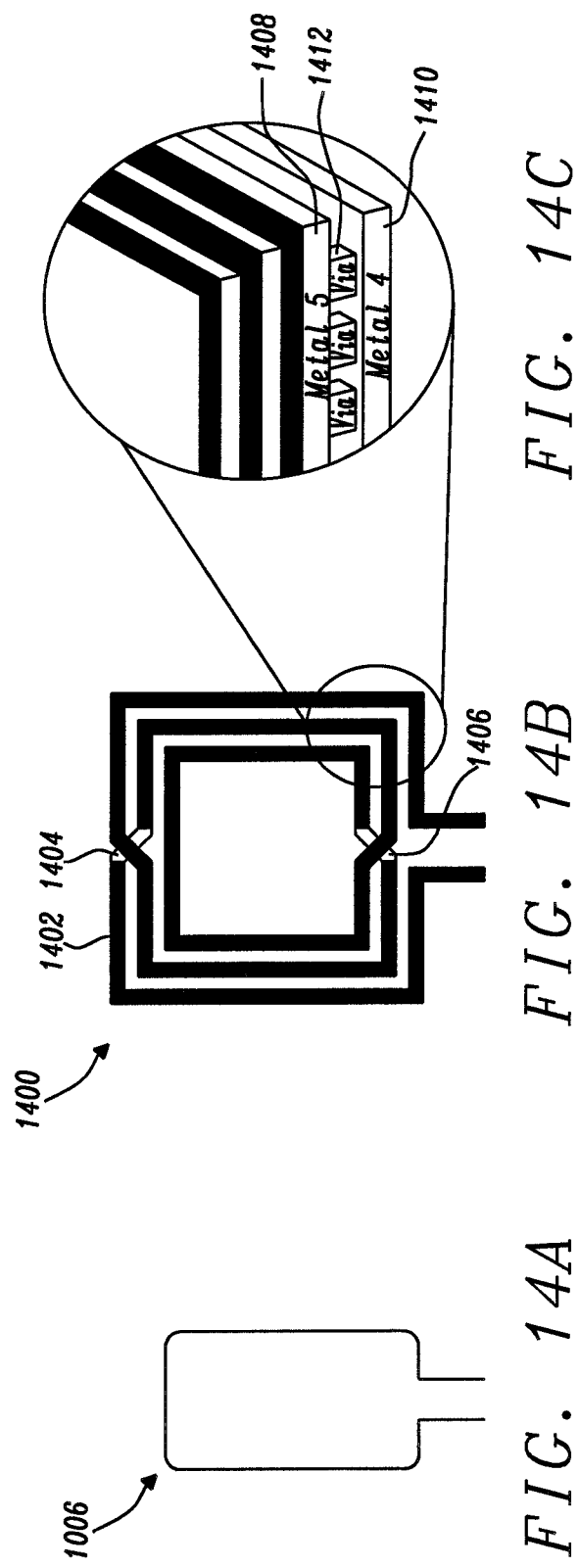

INDUCTOR ARRANGEMENT

TECHNICAL FIELD

The present disclosure relates to an inductor arrangement. In particular this disclosure relates to an inductor arrangement that is arranged to cancel external magnetic fields whilst occupying a small area and is suitable for a quadrature oscillator circuit.

BACKGROUND

Inductors implemented in a circuit are susceptible to coupling from external magnetic fields. The external magnetic fields may originate from other components within the circuit and/or may alternatively arise from an external source. Coupling of external magnetic fields is a form of electromagnetic interference and can negatively impact the performance of the circuit.

A radio frequency (RF) transceiver is a type of wireless transceiver comprising circuitry that enables both transmitting and receiving of RF signals. An oscillator circuit is used to generate an RF signal for the RF transceiver. An RF transceiver may be implemented in an integrated circuit (IC) on a chip.

An oscillator circuit may comprise inductors. For example, FIG. 1(a) shows a schematic of a tiny quadrature oscillator circuit, herein referred to as a quadrature oscillator circuit 100, comprising four class-D amplifiers of the type shown in FIG. 1(b), where each class-D amplifier comprises an inductor (Massoud Tohidian et. al., A Tiny Quadrature Oscillator Using Low-Q Series LC Tanks, IEEE Microwave and Wireless Components Letters, Vol. 25, No. 8, August 2015). The inclusion of inductors means that the quadrature oscillator circuit 100 is susceptible to magnetic coupling. Additionally, inductors can occupy a large area on the chip.

SUMMARY

It is an object of this disclosure to provide an inductor arrangement that is substantially insensitive to magnetic coupling and occupies a small chip area.

According to a first aspect of the disclosure there is provided an inductor arrangement, comprising a first inductor structure comprising one or more inductors at least partially on a first layer, and a second inductor structure comprising one or more inductors at least partially on a second layer, wherein the inductors are arranged such that currents induced by an external magnetic field are substantially cancelled in at least one of the first inductor structure and the second inductor structure, and the, or each, inductor of the second inductor structure overlaps, at least partially, the, or each, inductor of the first inductor structure.

Optionally, a portion of the second inductor structure passes above or below a portion of the first inductor structure via the second layer.

Optionally, the first layer is at a first depth with respect to a surface of a chip, and the second layer is at a second depth with respect to the surface of the chip.

Optionally, the first inductor structure comprises a first inductor and a second inductor that are coupled such that currents induced in the first inductor structure by the external magnetic field are substantially cancelled.

Optionally, the first inductor is arranged to generate a first generated magnetic field and the second inductor is arranged to generate a second generated magnetic field when an operational current flows through the first and second inductors, and the first and second generated magnetic fields are approximately equal and with opposite orientations such that they substantially cancel each other out.

Optionally, the first inductor structure is substantially symmetric and comprises a first axis of symmetry between the first inductor and the second inductor.

Optionally, the first inductor and the second inductor are adjacent.

Optionally, the first inductor and the second inductor are substantially rectangular in shape, such that each inductor comprises a width and a length, the length being longer than the width.

Optionally, the length of the first inductor is adjacent to the length of the second inductor.

Optionally, the first inductor and the second inductor are substantially triangular in shape, such that each inductor comprises a width, a height and a length, the length being longer than each of the width and the height.

Optionally, the length of the first inductor is adjacent to the length of the second inductor.

Optionally, the second inductor structure comprises a third inductor.

Optionally, the third inductor is arranged to generate a third generated magnetic field, the third generated magnetic field contributing to the external magnetic field provided to the first inductor structure.

Optionally, the second inductor structure comprises a fourth inductor, the third inductor and the fourth inductor are coupled such that currents induced in the second inductor structure by the external magnetic field are substantially cancelled.

Optionally, the first inductor is arranged to generate a first generated magnetic field and the second inductor is arranged to generate a second generated magnetic field when an operational current flows through the first and second inductors, the first and second generated magnetic fields are approximately equal and with opposite orientations such that they substantially cancel each other out, the third inductor is arranged to generate a third generated magnetic field and the fourth inductor is arranged to generate a fourth generated magnetic field when the operational current flows through the third and fourth inductors, and the third and fourth generated magnetic fields are approximately equal and with opposite orientations such that they substantially cancel each other out.

Optionally, the first inductor structure is substantially symmetric and comprises a first axis of symmetry between the first inductor and the second inductor, and the second inductor structure is substantially symmetric and comprises a second axis of symmetry between the third inductor and the fourth inductor.

Optionally, the first axis of symmetry is approximately perpendicular to the second axis of symmetry.

Optionally, the first inductor and the second inductor are adjacent, and the third inductor and the fourth inductor are adjacent.

Optionally, the first inductor, the second inductor, the third inductor and the fourth inductor are substantially rectangular in shape, such that each inductor comprises a width and a length, the length being longer than the width.

Optionally, the length of the first inductor is adjacent to the length of the second inductor, and the length of the third inductor is adjacent to the length of the fourth inductor.

Optionally, the first inductor, the second inductor, the third inductor and the fourth inductor are substantially triangular in shape, such that each inductor comprises a width, a height and a length, the length being longer than each of the width and the height.

Optionally, the length of the first inductor is adjacent to the length of the second inductor, and the length of the third inductor is adjacent to the length of the fourth inductor.

Optionally, the inductor arrangement comprises an independent inductor substantially enclosing an area occupied by the first inductor structure and the second inductor structure.

Optionally, the first inductor structure is orientated at approximately 90° with respect to the second inductor structure.

Optionally, the inductor arrangement comprises a third inductor structure comprising one or more inductors at least partially on a third layer, wherein the third inductor structure overlaps, at least partially, the first inductor structure and the second inductor structure.

Optionally, the first layer is at a first depth with respect to a surface of a chip, the second layer is at a second depth with respect to the surface of the chip, and the third layer is at a third depth with respect to the surface of the chip.

Optionally, the third inductor structure comprises a fifth inductor and a sixth inductor that are coupled such that currents induced in the third inductor structure by the external magnetic field are substantially cancelled.

Optionally, the fifth inductor is arranged to generate a fifth generated magnetic field and the sixth inductor is arranged to generate a sixth generated magnetic field when an operational current flows through the fifth and sixth inductors, and the fifth and sixth generated magnetic fields are approximately equal and with opposite orientations such that they substantially cancel each other out.

Optionally, the inductor arrangement comprises a fourth inductor structure comprising one or more inductors at least partially on the third layer, wherein the fourth inductor structure overlaps, at least partially, the first inductor structure and the second inductor structure.

Optionally, the first layer is at a first depth with respect to a surface of a chip, the second layer is at a second depth with respect to the surface of the chip, and the third layer is at a third depth with respect to the surface of the chip.

Optionally, the third inductor structure comprises a fifth inductor and a sixth inductor that are coupled such that currents induced in the third inductor structure by the external magnetic field are substantially cancelled, and the fourth inductor structure comprises a seventh and eighth inductor that are coupled such that currents induced in the fourth inductor structure by the external magnetic field are substantially cancelled.

Optionally, the fifth inductor is arranged to generate a fifth generated magnetic field and the sixth inductor is arranged to generate a sixth generated magnetic field when an operational current flows through the fifth and sixth inductors, the fifth and sixth generated magnetic fields are approximately equal and with opposite orientations such that they substantially cancel each other out, the seventh inductor is arranged to generate a seventh generated magnetic field and the eighth inductor is arranged to generate an eighth generated magnetic field when the operation current flows through the seventh and eighth inductors, and the seventh and eighth generated magnetic fields are approximately equal and with opposite orientations such that they substantially cancel each other out.

According to a second aspect of the disclosure there is provided an oscillator circuit comprising an inductor arrangement, the inductor arrangement comprising a first inductor structure comprising one or more inductors at least partially on a first layer, and a second inductor structure comprising one or more inductors at least partially on a second layer, wherein the inductors are arranged such that currents induced by an external magnetic field are substantially cancelled in at least one of the first inductor structure and the second inductor structure, and the, or each, inductor of the second inductor structure overlaps, at least partially, the, or each, inductor of the first inductor structure.

Optionally, the oscillator circuit is a quadrature oscillator circuit.

Optionally, the oscillator circuit comprises a plurality of inverters.

Optionally each of the inverters is coupled via an inductor of the inductor arrangement.

According to a third aspect of the disclosure there is provided an oscillator circuit comprising a plurality of inductors, wherein each inductor is of opposite polarity to its neighbouring inductors.

Optionally, the oscillator circuit comprises a plurality of inverters, wherein each inverter is coupled to a next inverter via an inductor.

Optionally, the oscillator circuit arranged as a quadrature oscillator circuit, wherein the plurality of inverters comprises a first, second, third and fourth inverter, the plurality of inductors comprises a first, second, third and fourth inductor, the first inverter is coupled to the second inverter via the first inductor, the second inverter is coupled to the third inverter via the second inductor, the third inverter is coupled to the fourth inverter via the third inductor, the fourth inverter is coupled to the first inverter via the fourth inductor, and the first inductor and the third inductor have the same polarity and are of opposite polarity to that of the second inductor and the fourth inductor.

BRIEF DESCRIPTION OF THE DRAWINGS

The disclosure is described in further detail below by way of example and with reference to the accompanying drawings, in which:

FIG. 8(A) is a schematic of the second type of inductor arrangement presented in FIG. 7, with a first type of coupling between inductors, FIG. 8(B) is a schematic of the second type of inductor arrangement presented in FIG. 7, with a second type of coupling between inductors, FIG. 8(C) is a schematic of a third type of inductor arrangement;

FIG. 9(A) is a further schematic of the second type of inductor arrangement with the second type of coupling between inductors and FIG. 9(B) is a further schematic of the third type of inductor arrangement, illustrating induced current flow;

FIG. 10(A) is a schematic of an inductor arrangement in accordance with a second embodiment of this disclosure, the inductor arrangement comprising a first inductor structure, a schematic of which is shown in FIG. 10(B), and a second inductor structure, a schematic of which is shown in FIG. 10(C);

FIG. 11(A) is a schematic of an inductor arrangement in accordance with a third embodiment of this disclosure, the inductor arrangement comprising a first inductor structure, a schematic of which is shown in FIG. 11(B), and a second inductor structure, a schematic of which is shown in FIG. 11(C);

FIG. 13(A) is a schematic of an inductor arrangement in accordance with a sixth embodiment of this disclosure, FIG. 13(B) is a schematic of an inductor arrangement in accordance with a seventh embodiment of this disclosure, FIG. 13(C) is a schematic of an inductor arrangement in accordance with a eighth embodiment of this disclosure, FIG. 13(D) is a schematic of a third inductor structure of the inductor arrangement of the sixth embodiment as shown in FIG. 13(A), FIG. 13(E) is a schematic of a third inductor structure of the inductor arrangement of the seventh embodiment as shown in FIG. 13(B), FIG. 13(F) is a schematic of a third inductor structure of the inductor arrangement of the eight embodiment as shown in FIG. 13(C); and FIGS. 14A, 14B and 14C are schematics of a single loop inductor and an interwind inductor.

DETAILED DESCRIPTION

Figure 1A:
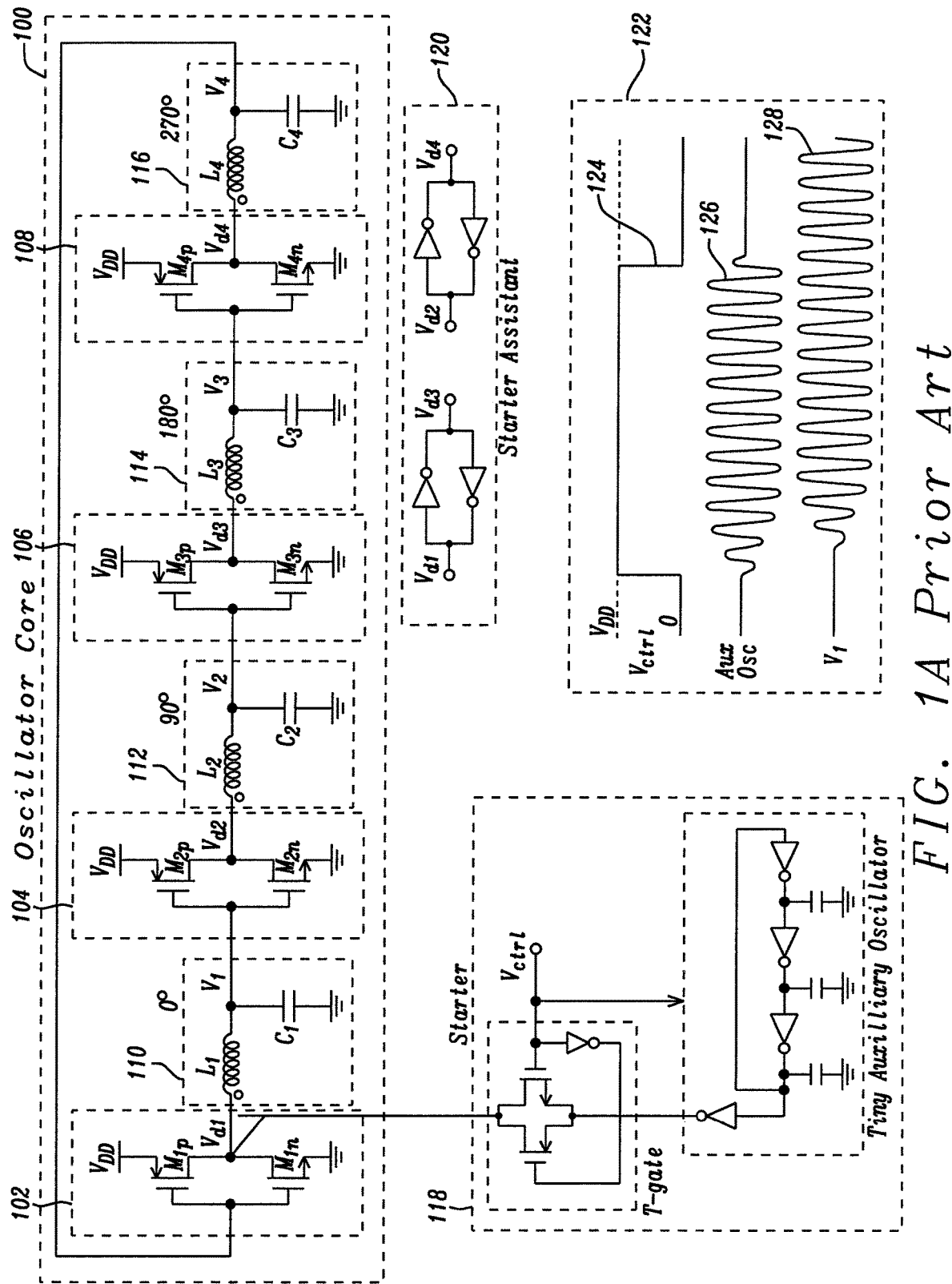
FIG. 1(A) is a schematic of a quadrature oscillator circuit and FIG. 1(B) is a schematic of a class-D amplifier in accordance with the prior art.

There is a direct relation between the power consumption of an oscillator circuit and the phase noise of the RF signal that it produces, for example a factor of two increase in power consumption will reduce the phase noise by a factor of two. As it is desirable to minimise both the phase noise and the power consumption of the oscillator circuit there is a trade-off between these two quantities. Different oscillator circuits may be compared using a figure of merit (FoM) that represents the performance of each oscillator circuit, where the FoM takes into account the fundamental trade-off between phase noise and power consumption, in addition to other properties of the oscillator circuits. For example, the other properties may include chip area.

LC oscillators, comprising an LC tank circuit that comprises an inductor and a capacitor, are typically used as the oscillator circuit for RF transceivers. This is a result of LC oscillators exhibiting good noise performance for a given amount of power, as is shown by their FoM. However, an LC oscillator is susceptible to frequency pulling. Frequency pulling is a variation in the frequency of the oscillator circuit arising due to the influence of a component or circuit that is external to the oscillator circuit.

A power amplifier PA of the RF transceiver outputs a PA output signal with a frequency that is approximately equal to that of the LC oscillator. The PA output signals are large modulated signals and frequency pulling results from coupling of the large modulated signals from the PA to the LC oscillator.

Coupling may be classified as either magnetic coupling or electrical coupling. Magnetic coupling may, for example, result from coupling of the PA output signals through a transformer, a bond wire or an LC network to the LC tank circuit of the LC oscillator. Electrical coupling may, for example, result from coupling of the PA output signals through a supply, a ground or through a silicon substrate.

Electrical coupling through the ground and the supply can be significantly reduced by careful design of the IC. For example, coupling through the ground and supply may be reduced by implementation of low-dropout (LDO) regulators with a high power supply rejection ratio (PSRR), implementation of a separate pin and pad for the LC tank circuit or implementation of filtering on the supply. Coupling through the silicon substrate scales with physical distance and IC layout techniques such as triple-well isolation and implementation of guard rings can further reduce coupling.

Magnetic coupling may be reduced by increasing the physical distance between the components of the chip. However, increasing the physical distance between components results in occupation of a larger area of the chip, which is undesirable. Therefore, typically, magnetic coupling provides a greater contribution to the frequency pulling that is exhibited by the LC oscillator as a result of the PA output signals than electrical coupling. It has also been experimentally verified that magnetic coupling is the dominant coupling factor.

Frequency pulling resulting from magnetic coupling, herein referred to magnetic frequency pulling, may be reduced by implementation of one or more magnetic shields. The magnetic shields can be implemented by using one or more metal layers of the IC. However, implementation of magnetic shields can lead to unacceptable performance losses of the LC oscillator.

To mitigate magnetic frequency pulling, a common solution is to operate the LC oscillator at twice the required frequency. A second harmonic of the PA is typically 30 dB-40 dB lower than a fundamental frequency, which reduces the magnetic frequency pulling by 30 dB-40 dB. However, operating the LC oscillator at twice the required frequency increases the power consumption of the LC oscillator by a factor of two. Additionally, it is necessary to implement frequency dividers at an output of the LC oscillator, which may result in a further increase in the power consumption by a factor of two.

In addition to the magnetic frequency pulling, LC oscillators have a further disadvantage in that they occupy a significant amount of chip area (0.1 mm$^2$-0.5 mm$^2$), mainly due to the size of the inductor. Additionally, the size of the inductor is substantially independent of the scaling of CMOS technology. As CMOS technology scales to smaller sizes, the technology tends to become significantly more expensive per mm$^2$, and therefore the inability to scale the inductors is particularly costly.

An alternative type of oscillator circuit is an RC ring oscillator. An RC ring oscillator comprises a plurality of inverters or inverter-like structures that are arranged in a ring formation. In the ring formation each inverter or inverter-like structure has its output coupled to an input of a subsequent inverter or inverter-like structure. A final inverter or inverter-like structure has its output coupled to a first inverter thereby forming a closed ring arrangement. Each inverter or inverter-like structure is coupled to a load capacitor.

Figure 2:
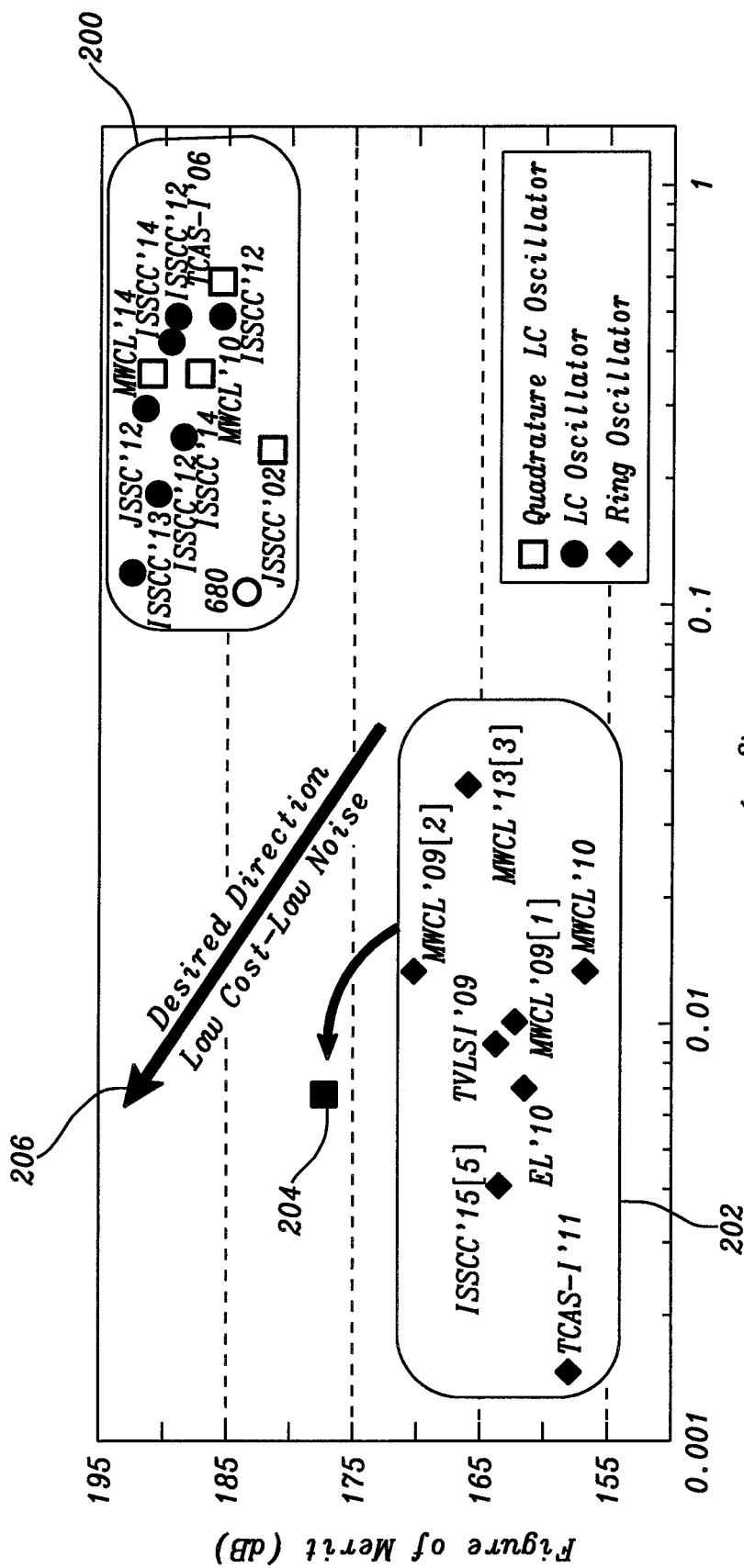
FIG. 2 is a graph of a figure of merit (FoM) versus chip area for different types of oscillator circuits in accordance with the prior art.

FIG. 2 shows a plot of the FoM and chip area for a group of LC oscillators 200 and a group of RC ring oscillators 202 (Massoud Tohidian et. al., A Tiny Quadrature Oscillator Using Low-Q Series LC Tanks, IEEE Microwave and Wireless Components Letters, Vol. 25, No. 8, August 2015). RC ring oscillators have approximately one hundred times greater power consumption than that of LC oscillators for the same noise performance. This corresponds to a 20 dB lower FoM for the group of RC ring oscillators 202 when compared to the group of LC oscillators 200.

RC ring oscillators offer several advantages over LC oscillators. The chip area occupied by RC ring oscillators in 55 nm CMOS technology is typically less than 0.02 mm$^2$ and is likely to decrease further as inverters and capacitors scale with newer CMOS technology. RC oscillators are not susceptible to magnetic frequency pulling. If other coupling mechanisms, such as through the supply, ground and the silicon substrate can be kept sufficiently low then the RC ring oscillator can operate at the desired frequency, rather than having to operate at double the frequency. This saves power, and also eliminates the requirement for frequency dividers, thereby saving more power. The RC ring oscillator is also more tunable than the LC oscillator, such that a single RC ring oscillator design can operate over multiple frequency bands. Additionally, if the tuning range is insufficient for a given application, the small area occupied by an RC ring oscillator makes it possible to simply put two or more of them side by side on a chip.

For virtually all RF transceivers, the power consumption of RC ring oscillators is too high such that any practical implementation of an RF transceiver uses LC oscillators. As an additional point, the frequency dividers that are used with the LC oscillator generally consume more power than the LC oscillator itself.

The quadrature oscillator circuit 100 of FIG. 1(A) is a trade-off between the LC oscillators and the RC ring oscillators as previously described. The quadrature oscillator circuit 100 comprises an RC ring oscillator and a plurality of resonant sections. Each inverter of the RC ring oscillator is coupled to the next inverter in the ring via a resonant section. Each resonant section comprises an inductor and a capacitor and therefore may be referred to as an LC tank circuit. As the quadrature oscillator circuit 100 still uses inductors, it retains the problem of magnetic frequency pulling.

An inductor may be said to have poorer quality compared to another inductor if it has a higher resistance for the same inductance. Scaling down an inductor such that it occupies a smaller area, whilst maintaining the same inductance, results in an improvement in quality (Q) factor because the smaller area inductor can use a shorter length of wire that has a lower resistance. When it is acceptable to have a lower Q factor, thinner wire may be used to continue scaling to even smaller inductor sizes.

Theory states that even when the inductors are of relatively poor quality, with a low Q factor, the quadrature oscillator circuit 100 still exhibits a good noise performance. The inclusion of low Q factor inductors is sufficient to bring the phase noise performance of the quadrature oscillator circuit 100 in line with that of LC oscillators.

The quadrature oscillator circuit 100 illustrated in FIG. 1(A) may be tunable. For example, it may be tuned from 2.6 GHz to 5.0 GHz.

The quadrature oscillator circuit 100 is shown in FIG. 2 at point 204, where it can be observed that the quadrature oscillator circuit 100 achieves approximately 10 dB higher FoM than the group of RC ring oscillators 202 for a similar chip area. The quadrature oscillator circuit 100 has an approximately ten times greater power consumption than that of the LC oscillators 200. An arrow 206 illustrates the desired direction for an improved oscillator circuit, corresponding to an increased FoM and reduction in chip area.

The magnetic coupling through an inductor is a result of coupling to an external magnetic field. The sensitivity of an inductor to an external magnetic field is dependent on a combination of the physical size (the radius) of the inductor and its number of windings. Therefore, the inductor size is not solely an indicator of its sensitivity to the external magnetic field and therefore is not solely an indicator of the quadrature oscillator circuit's 100 sensitivity to magnetic frequency pulling.

A reduction in quality (Q) factor of an inductor and therefore the Q factor of the associated resonant section leads to an increase in sensitivity of the resonant section to magnetic coupling. Therefore, the quadrature oscillator circuit 100 may be more sensitive to magnetic frequency pulling than a traditional LC oscillator that operates at twice the required frequency.

The quadrature oscillator circuit 100 of FIG. 1(A) comprises a first inverter 102, a second inverter 104, a third inverter 106, a fourth inverter 108, a first resonant section 110, a second resonant section 112, a third resonant section 114 and a fourth resonant section 116. Each inverter comprises a p-type transistor and an n-type transistor.

The first inverter 102 comprises a first p-type transistor $M_{1p}$ and a first n-type transistor $M_{1n}$. A source of the first p-type transistor $M_{1p}$ is coupled to a supply voltage $V_{DD}$; a drain of the first p-type transistor $M_{1p}$ is coupled to an output of the first inverter 102; and a gate of the first p-type transistor $M_{1p}$ is coupled to an input of the first inverter 102. A drain of the first n-type transistor $M_{1n}$ is coupled to the output of the first inverter 102; a source of the first n-type transistor $M_{1n}$ is coupled to ground; and a gate of the first n-type transistor $M_{1n}$ is coupled to the input of the first inverter 102.

The second inverter 104 comprises a second p-type transistor $M_{2p}$ and a second n-type transistor $M_{2n}$. A source of the second p-type transistor $M_{2p}$ is coupled to the supply voltage $V_{DD}$; a drain of the second p-type transistor $M_{2p}$ is coupled to an output of the second inverter 104; and a gate of the second p-type transistor $M_{2p}$ is coupled to an input of the second inverter 104. A drain of the second n-type transistor $M_{2n}$ is coupled to the output of the second inverter 104; a source of the second n-type transistor $M_{2n}$ is coupled to ground; and a gate of the second n-type transistor $M_{2n}$ is coupled to the input of the second inverter 104.

The third inverter 106 comprises a third p-type transistor $M_{3p}$ and a third n-type transistor $M_{3n}$. A source of the third p-type transistor $M_{3p}$ is coupled to the supply voltage $V_{DD}$; a drain of the third p-type transistor $M_{3p}$ is coupled to an output of the third inverter 106; and a gate of the third p-type transistor $M_{3p}$ is coupled to an input of the third inverter 106. A drain of the third n-type transistor $M_{3n}$ is coupled to the output of the third inverter 106; a source of the third n-type transistor $M_{3n}$ is coupled to ground; and a gate of the third n-type transistor $M_{3n}$ is coupled to the input of the third inverter 106.

The fourth inverter 108 comprises a fourth p-type transistor $M_{4p}$ and a fourth n-type transistor $M_{4n}$. A source of the fourth p-type transistor $M_{4p}$ is coupled to the supply voltage $V_{DD}$; a drain of the fourth p-type transistor $M_{4p}$ is coupled to an output of the fourth inverter 108; and a gate of the fourth p-type transistor $M_{4p}$ is coupled to an input of the fourth inverter 108. A drain of the fourth n-type transistor $M_{4n}$ is coupled to the output of the fourth inverter 108; a source of the fourth n-type transistor $M_{4n}$ is coupled to ground; and a gate of the fourth n-type transistor $M_{4n}$ is coupled to the input of the fourth inverter 108.

It will be appreciated that alternative transistor arrangements are possible in accordance with the understanding of the skilled person. For example, it may be possible to replace a p-type transistor with an n-type transistor and/or an n-type transistor with a p-type transistor.

The first resonant section 110 comprises a first inductor $L_1$ and a first capacitor $C_1$; the second resonant section 112 comprises a second inductor $L_2$ and a second capacitor $C_2$; the third resonant section 114 comprises a third inductor $L_3$ and a third capacitor $C_3$; and the fourth resonant section 116 comprises a fourth inductor $L_4$ and a fourth capacitor $C_4$. A capacitor is a type of capacitive element and an inductor is a type of inductive element.

The output of the first inverter 102 is coupled to a first terminal of the first inductor $L_1$, which has a second terminal coupled to a first terminal of the first capacitor $C_1$ at a first node. A second terminal of the first capacitor $C_1$ is coupled to ground and the first node is coupled to an input of the second inverter 104.

An output of the second inverter 104 is coupled to a first terminal of the second inductor $L_2$, which has a second terminal coupled to a first terminal of the second capacitor $C_2$ at a second node. A second terminal of the second capacitor $C_2$ is coupled to ground and the second node is coupled to an input of the third inverter 106.

An output of the third inverter 106 is coupled to a first terminal of the third inductor $L_3$, which has a second terminal coupled to a first terminal of the third capacitor $C_3$ at a third node. A second terminal of the third capacitor $C_3$ is coupled to ground and the third node is coupled to an input of the fourth inverter 108.

An output of the fourth inverter 108 is coupled to a first terminal of the fourth inductor $L_4$, which has a second terminal coupled to a first terminal of the fourth capacitor $C_4$ at a fourth node. A second terminal of the fourth capacitor $C_4$ is coupled to ground and the fourth node is coupled to the input of the first inverter 102.

In operation, the first inverter 102 outputs a first square wave signal $V_{d1}$ that is received at an input of the first resonant section 110. The first resonant section 110 outputs a first sinusoidal output signal $V_1$. The first sinusoidal output signal $V_1$ is received at an input of the second inverter 104.

The second inverter 104 outputs a second square wave signal $V_{d2}$ that is received at an input of the second resonant section 112. The second resonant section 112 outputs a second sinusoidal output signal $V_2$ which has a 90° phase shift when compared to the first sinusoidal output signal $V_1$. The second sinusoidal output signal $V_2$ is received at an input of the third inverter 106.

The third inverter 106 outputs a third square wave signal $V_{d3}$ that is received at an input of the third resonant section 114. The third resonant section 114 outputs a third sinusoidal output signal $V_3$ which has a 180° phase shift when compared to the first sinusoidal output signal $V_1$. The third sinusoidal output signal $V_3$ is received at an input of the fourth inverter 108.

The fourth inverter 108 outputs a fourth square wave signal $V_{d4}$ that is received at an input of the fourth resonant section 116. The fourth resonant section 116 outputs a fourth sinusoidal output signal $V_4$ which has a 270° phase shift when compared to the first sinusoidal output signal $V_1$. The fourth sinusoidal output signal $V_4$ is received at an input of the first inverter 102.

Each of the square wave signals has a minimum value equal to ground and a maximum value equal to the supply voltage $V_{DD}$. A voltage range over which a square wave signal as output by an inverter varies may be referred to as an output swing. The output swing of the four inverters 102, 104, 106, 108 as described above is equal to the supply voltage $V_{DD}$.

In consideration of two time varying signals, such as sinusoidal waves, with an equal frequency, a first signal may be denoted by "I", meaning in-phase, and a second signal with a phase shift of 90° with respect to the first signal may be denoted by "Q", meaning quadrature.

Also shown in FIG. 1(A) is a starter circuit 118, a starter assistant 120 and oscillator circuit waveforms 122. The starter circuit is used to initiate the generation of the RF signal by the oscillator circuit 100 and the initiation is aided by the starter assistant 120. The oscillator circuit waveforms 122 show a voltage control signal 124 of the starter circuit 118, an output 126 of the starter circuit 118 and the first sinusoidal output signal $V_1$ 128.

Figure 1B:
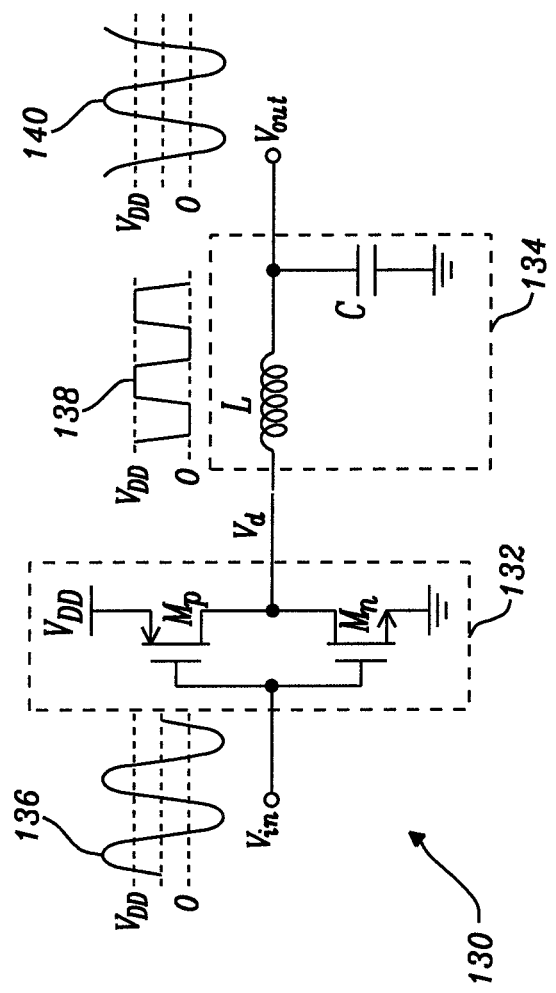

FIG. 1(B) shows a schematic of a class-D amplifier 130 comprising an inverter 132 and a resonant section 134. Each of the first inverter 102 and the first resonant section 110; the second inverter 104 and the second resonant section 112; the third inverter 106 and the third resonant section 114; and the fourth inverter 108 and the fourth resonant section 116, forms a class-D amplifier 130 of the type shown in FIG. 1(A).

The inverter 132 comprises a p-type transistor $M_p$ and a n-type transistor $M_n$. The resonant section 134 comprises an inductor L and a capacitor C. The inverter 132 is arranged and as described for the first, second, third and fourth inverters 102, 104, 106, 108. The resonant section 134 is arranged and as described for the first, second, third and fourth resonant section 110, 112, 114, 116. The operation of the class-D amplifier 130 is as described for the inverters 102, 104, 106, 108 and resonant sections 110, 112, 114, 116 of FIG. 1(A).

The inverter 132 receives a sinusoidal input voltage $V_{in}$ 136 and outputs a square wave signal $V_d$ 138. The resonant section 134 receives the square wave signal $V_d$ 138 and outputs a sinusoidal output voltage $V_{out}$ 140 which has a 90° phase shift when compared to the sinusoidal input voltage $V_{in}$ 136.

Figure 3:
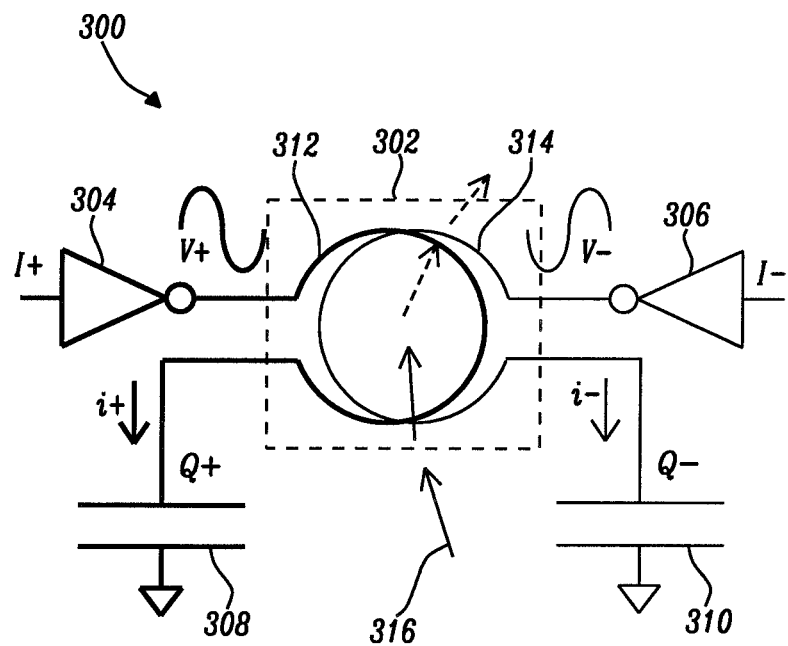
FIG. 3 is a schematic of an oscillator circuit component comprising a transformer.

FIG. 3 is a schematic of an oscillator circuit component 300 comprising a transformer 302. The term "oscillator circuit component" is used to identify a component that comprises at least one circuit element that may be used in oscillator circuit, such as the quadrature oscillator circuit 100. In this disclosure oscillator circuit components comprise two class-D amplifiers of the type shown in FIG. 1(B), and the inductors of each of the class-D amplifiers are arranged in an inductor arrangement to provide a specific function. Otherwise, the individual class-D amplifiers operate as described for the class-D amplifier 130 of FIG. 1(B).

The oscillator circuit component 300 is used to illustrate a physical arrangement of inductors and the inclusion of additional circuit elements is used to aid clarity with regards to how the oscillator circuit component 300 could be implemented in a quadrature oscillator circuit. Subsequent oscillator circuit components in this disclosure are also shown for the purpose of illustrating how an arrangement of inductors may be implemented in an oscillator circuit The oscillator circuit component 300 comprises the transformer 302, a first inverter 304, a second inverter 306, a first capacitor 308 and a second capacitor 310. The transformer comprises a first inductor 312 and a second inductor 314. The first inductor 312 and the second inductor 314 are arranged such that one inductor is positioned above the other inductor. For example, the first inductor 312 may be positioned on a first plane, and the second inductor 314 may be positioned on a second plane that is at a distance from the first plane. Each of the planes may correspond to layers on a chip. The first inductor 312 and the second inductor 314 substantially overlap—in FIG. 3 they are illustrated with a slightly exaggerated separation for the clarity of illustration.

For implementation of the oscillator circuit component 300 in the quadrature oscillator circuit 100, it is necessary that the phase difference between the two inverters 304, 306 is approximately 180° and therefore the two inverters 304, 306 may correspond to any two non-neighbouring inverters in the quadrature oscillator circuit 100. The currents flowing through the inductors 312, 314 may be approximately equal and can be of opposite polarity. There is 180° phase difference between currents I+, I−, and currents Q+, Q− each have a 90° phase difference with respect to I+, I−.

The first inductor 312 and the first capacitor 308 correspond to the inductor and the capacitor, respectively, of the resonant section coupled to the output of the inverter corresponding to the first inverter 304 in the quadrature oscillator circuit 100. The second inductor 314 and the second capacitor 310 correspond to the inductor and the capacitor, respectively, of the resonant section coupled to the output of the inverter corresponding to the second inverter 306 in the quadrature oscillator circuit 100.

For example, the first inverter 304 may correspond to the first inverter 102 of the quadrature oscillator circuit 100 and the second inverter 306 may correspond to the third inverter 106 of the quadrature oscillator circuit 100. The first capacitor 308 may correspond to the first capacitor $C_1$ and the second capacitor 310 may correspond to the third capacitor $C_3$ of the quadrature oscillator circuit 100. The first inductor 312 may correspond to the first inductor $L_1$ and the second inductor 314 may correspond to the third inductor $L_3$ of the quadrature oscillator circuit 100.

Additionally, more than one oscillator circuit component 300 may be implemented in the quadrature oscillator circuit 100. For example, the oscillator circuit component 300 may correspond to half of the quadrature oscillator circuit 100.

The first inductor 312 and the first capacitor 308 form a first resonant section (312+308) and the second inductor 314 and the second capacitor 310 form a second resonant section (314+310). The transformer 302 provides mutual inductive coupling between the first inductor 312 and the second inductor 314, Therefore, the effective inductance of each of the two resonant sections (312+308), (314+310) is greater than that of resonant sections that do not implement the transformer 302. Additionally, by using the transformer 302 as shown in FIG. 3, the increase of effective inductance does not require a greater chip area. Furthermore, the area occupied by the transformer 302 is effectively halved when compared to an alternative "side-by-side" implementation of the inductors 312, 314.

As it is not necessary to maximise the Q factor of the inductor, as is the case in LC oscillator circuits, a coupling factor of the first inductor 312 and the second inductor 314 can be approximately equal to one.

The transformer 302 may be subject to an external magnetic field 316 which may, for example, be generated by the PA. Assuming that the first inductor 312 and the second inductor 314 enclose an equal area and are subject to the same external magnetic field 316, a magnetic flux passing through both the first inductor 312 and the second inductor 314 will be equal. It should be noted that the external magnetic field 316 as shown in FIG. 3 is merely illustrative of the transformer 302 being subject to the external magnetic field 316 and the direction or shape of the arrows are not limiting.

The external magnetic field 316 will influence the individual resonant sections of the quadrature oscillator circuit 100 implementing the first inductor 312 and the second inductor 314, by inducing currents in each of the first inductor 312 and the second inductor 314, which will result in magnetic frequency pulling. Therefore, it is desirable to cancel the effect of the external magnetic field 316.

Figure 4:
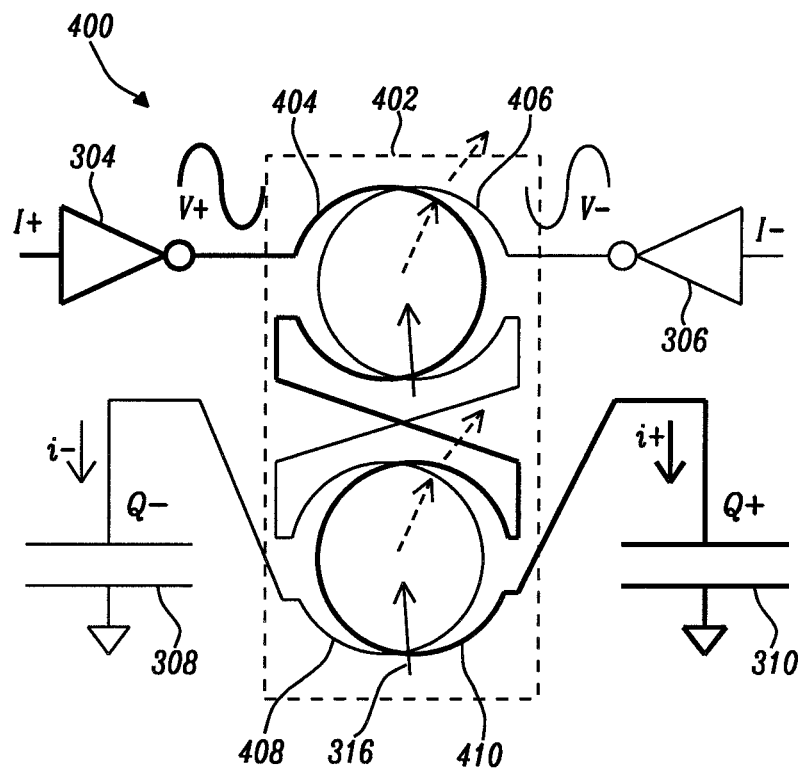
FIG. 4 is a schematic of an oscillator circuit component comprising a first type of inductor arrangement.

FIG. 4 is a schematic of an oscillator circuit component 400 comprising an inductor arrangement 402. Common features between the oscillator circuit component 400 and the oscillator circuit component 300 are represented by common reference numerals and variables.

The inductor arrangement 402 comprises a first inductor 404, a second inductor 406, a third inductor 408 and a fourth inductor 410. The first inductor 404 is coupled in series with the fourth inductor 410; and the second inductor 406 is coupled in series with the third inductor 408. The first inductor 404 and the second inductor 406 are arranged such that one inductor is positioned above the other inductor; and the third inductor 408 and the fourth inductor 410 are arranged such that one inductor is positioned above the other. The inductors 404, 406 form a first transformer, and the inductors 408, 410 form a second transformer, where the second transformer may be described as being "mirrored" with respect to the first transformer.

The first inductor 404 and the fourth inductor 410 are arranged such that a current induced in the first inductor 404 by the external magnetic field 316 is in an opposite direction to that of a current induced in the fourth inductor 410 by the external magnetic field 316. Therefore, any part of the external magnetic field 316 common to both the first inductor 404 and the fourth inductor 410 is cancelled. It will be appreciated that the effect of the external magnetic field on the second inductor 406 and the third inductor 408 will be as described for the first inductor 404 and the fourth inductor 410. As for FIG. 3, it should be noted that the external magnetic field 316 as shown in FIG. 4 is merely illustrative of the inductor arrangement 402 being subject to the external magnetic field 316 and the direction or shape of the arrows are not limiting.

Each of the four inductors 404, 406, 408, 410 are sufficiently small such that coupling between the inductors 404, 406, 408, 410 will only impact their effective inductance, which may be taken into account in the design of the IC. Consequently, the four inductors 404, 406, 408, 410 may be positioned close together such that the external magnetic field 316 will be virtually identical for each of the four inductors 404, 406, 408, 410. For an identical external magnetic field 316, the induced currents effectively cancel, and the effect of the external magnetic field is substantially removed, thereby substantially eliminating magnetic frequency pulling.

Experiments have shown that for a practical system the external magnetic field 316 will be cancelled to an estimated 40 dB, which is comparable or better than the isolation obtained by operating a regular LC oscillator at twice the PA frequency. It is also possible to put an inductor pair in parallel, rather than series, which will lower the effective inductance of the associated resonant sections of the quadrature oscillator circuit 100, which may allow higher frequency operation, whilst maintaining the self inductance of each of the individual inductors 404, 406, 408, 410.

Figure 5B:
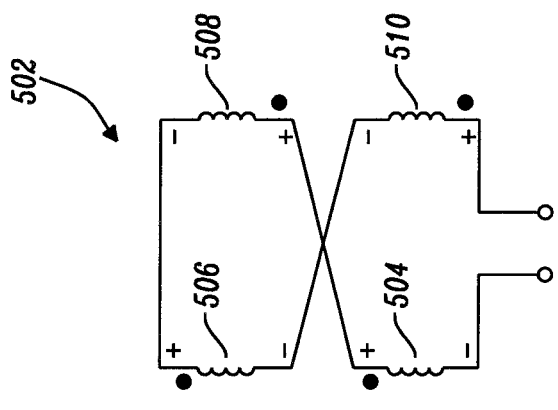
FIGS. 5A and 5B are schematics of a "figure-8" inductor in accordance with the prior art.
Figure 5A:
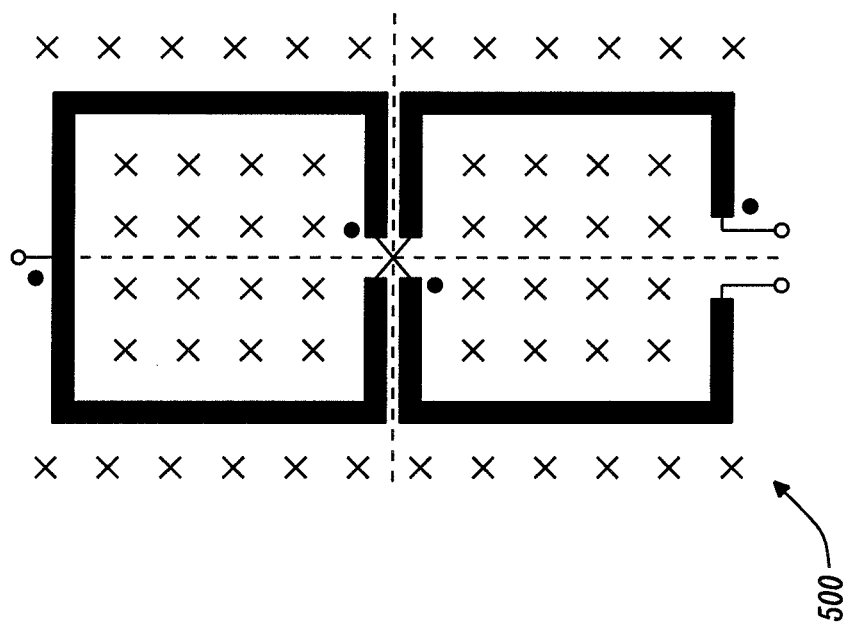

FIG. 5(A) is a schematic of a "figure-8" inductor 500, and FIG. 5(B) is an equivalent schematic 502 of the figure-8 inductor 500 (Ian David Sobering, Mitigating Oscillator Pulling Due to Magnetic Coupling in Monolithic Mixed-Signal Radio-Frequency Integrated Circuits, Thesis, Kansas State University 2014). The figure-8 inductor 500 comprises four inductors 504, 506, 508, 510 that are connected in series. The inductor 504 has an opposite polarity to that of inductor 508; and inductor 506 has an opposite polarity to that of inductor 510. Currents induced in the figure-8 inductor 500 when it is subject to an external electric field cancel each other out, such that no net voltage is induced across the figure-8 inductor 500 terminals. Consequently, the figure-8 inductor 500 is insensitive to external magnetic fields. Additionally, a current flowing through the figure-8 inductor 500 results in the generation of magnetic fields with opposite directions in the top half and the bottom half of the figure-8 inductor 500.

For certain applications, there are a number of drawbacks that make the oscillator circuit component 400 and the figure-8 inductor 500 unsuitable. The requirement for multiple inductors may be such that a self resonant frequency of the inductor arrangement 402 is reduced to a level that prevents practical implementation. Additionally, the Q factor of the inductor arrangement 402 or the figure-8 inductor 500 may be reduced due to the inductors requiring long lengths of metal for implementation which may also lead to increased electrical substrate coupling. Also, there may be unwanted coupling of I and Q components of a signal due to their proximity in the oscillator circuit 100.

Figure 6:
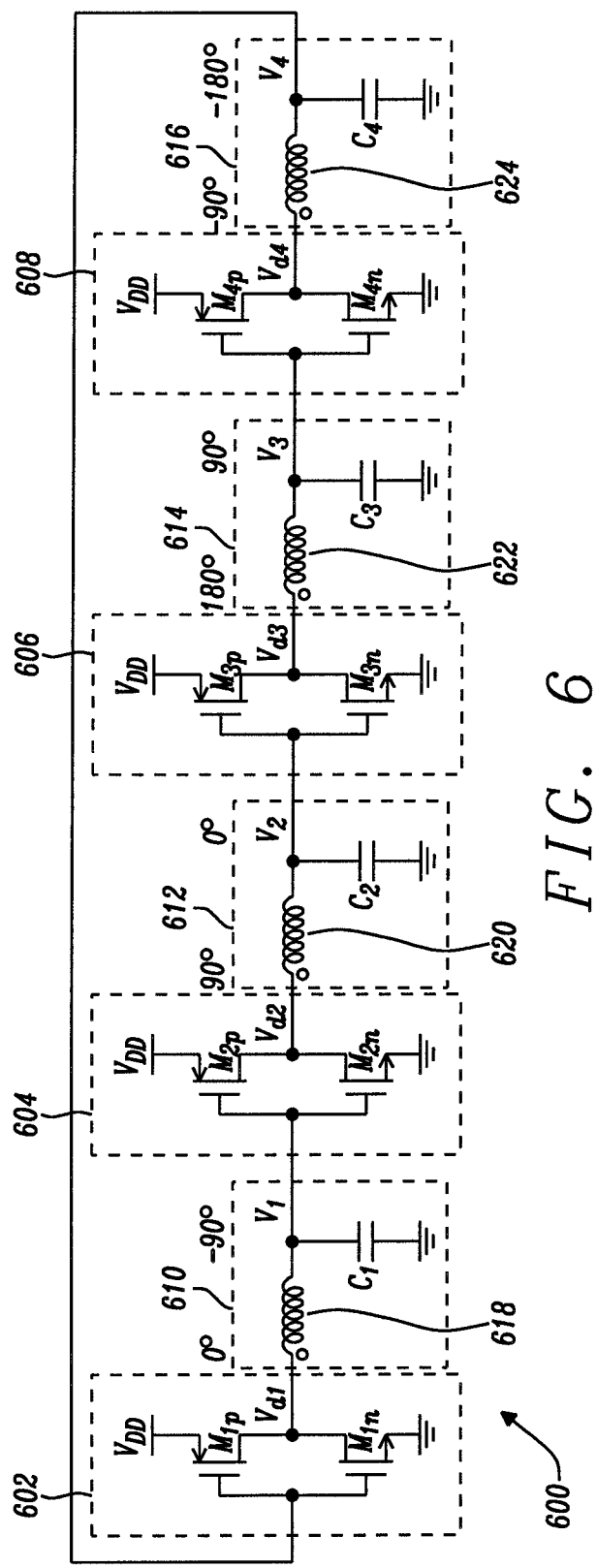
FIG. 6 is a schematic of a quadrature oscillator circuit in accordance with a first embodiment of this disclosure.

FIG. 6 is a schematic of a quadrature oscillator circuit 600 in accordance with a first embodiment of this disclosure. The quadrature oscillator circuit 600 is designed to be more robust to magnetic frequency pulling that the oscillator circuit 100 as described previously. Common features between the quadrature oscillator circuit 600 and the quadrature oscillator circuit 100 are represented by common reference numerals and variables. The operation of the quadrature oscillator circuit 600 is substantially as described for the quadrature oscillator circuit 100.

The quadrature oscillator circuit 600, is a type of oscillator circuit comprising a plurality of inverters. The plurality of inverters comprises a first inverter 602, a second inverter 604, a third inverter 606, a fourth inverter 608. The quadrature oscillator circuit 600 further comprises a plurality of resonant sections, each comprising an inductor and a capacitor. The plurality of resonant sections comprises a first resonant section 610, a second resonant section 612, a third resonant section 614 and a fourth resonant section 616. The first resonant section 610 comprises a first inductor 618; the second resonant section 612 comprises a second inductor 620; the third resonant section 614 comprises a third inductor 622; and the fourth resonant section 616 comprises a fourth inductor 624. The first inverter 602, the second inverter 604, the third inverter 606 and the fourth inverter 608 are equivalent to the first inverter 102, the second inverter 104, the third inverter 106 and the fourth inverter 108, respectively.

The first resonant section 610, the second resonant section 612, the third resonant section 614 and the fourth resonant section 616 are equivalent to the first resonant section 110, the second resonant section 112, the third resonant section 114 and the fourth resonant section 116, respectively, with the exception that the four inductors 618, 620, 622, 624 are implemented differently than the inductors of the quadrature oscillator circuit 100 of FIG. 1(A).

An output of the first inverter 602 is coupled to an input of the second inverter 604 via the first inductor 618; an output of the second inverter 604 is coupled to an input of the third inverter 606 via the second inductor 620; an output of the third inverter 606 is coupled to an input of the fourth inverter 608 via the third inductor 622 and an output of the fourth inverter 608 is coupled to an input of the first inverter 602 via the fourth inductor 624.

Each of the inductors 618, 620, 622 624 have opposite polarities when compared to their neighbours. For example, the first inductor 618 and the third inductor 622 have the same polarity and are of opposite polarity to that of the second inductor 620 and the fourth inductor 624. The inductors $L_1$, $L_2$, $L_3$, $L_4$ of the quadrature oscillator circuit 100 all have the same polarity.

The polarity of the inductors is denoted by a dot at one end of each of the inductors 618, 620, 622, 624 in FIG. 6. Inductors with dots at opposite ends, for example the first inductor 618 and the second inductor 620 have an opposite polarity. The first inductor 618 and the second inductors 620 are each wound round an axis in an opposite direction with respect to each other. The opposite direction is in reference to a winding and coupling of the first inductor 618 and the second inductor 620 such that if they are coupled, a current flowing from an input terminal of the first inductor 618 to an output terminal of the second inductor 620 would flow in a first direction, for example clockwise, around the first inductor 618, and would flow in an opposite direction, for example anti-clockwise, in the second inductor 620.

It will be appreciated that the inductors 618, 620 may not be directly coupled. If an external magnetic field induces a voltage in both the first inductor 618 and the second inductor 620, the induced currents will be in opposite directions. Consequently, the effect of the external magnetic field will be cancelled and the quadrature oscillator circuit 600 will have reduced or eliminated magnetic frequency pulling compared to the quadrature oscillator circuit 100. Induced currents may be defined as the current flow that results from the induced voltage.

There is a −90° phase shift between an input and an output of each of the resonant sections 610, 612, 614, 616 at its resonant frequency. There is a 180° phase shift between an input and an output of each of the four inverters 602, 604, 606, 608.

Assuming there is no mutual coupling between the four inductors 618, 620, 622, 624 and they have identical coupling to an external magnetic field, other than the impact of the opposite polarities of inductor pairs, the inverters 602, 604, 606, 608 may be considered as near ideal voltage sources. Any induced voltage across the inductors 618, 620, 622, 624 will be induced at the input of the next inverter 602, 604, 606, 608.

Due to the external magnetic field, a time-variant phase-variation of the voltage will be present across the capacitors $C_1$, $C_2$, $C_3$, $C_4$ and copied from the input to the output of each of the inverters 602, 604, 606, 608.

However, the phase-variation from an input to an output of any on of the inverters 602, 604, 606, 608 is equal and of opposite sign. Hence the total phase accumulation along the loop is approximately zero and the magnetic frequency pulling is substantially prevented.

Figure 7:
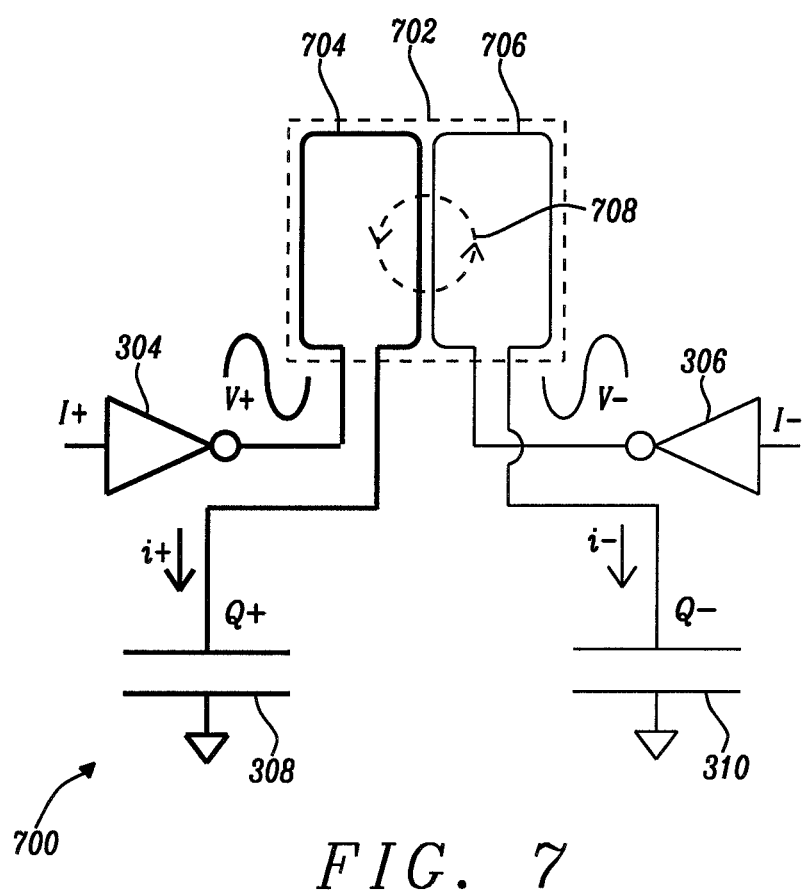
FIG. 7 is a schematic of an oscillator circuit component comprising a second type of inductor arrangement.

FIG. 7 is a schematic of an oscillator circuit component 700 comprising an inductor arrangement 702. Common features between the oscillator circuit component 700 and the oscillator circuit component 300 are represented by common reference numerals and variables. The inductor arrangement 702 comprises a first inductor 704 and a second inductor 706 that are positioned side-by-side, in that they are adjacent to each other. The first inductor 704 and the second inductor 706 are sufficiently close to substantially maximise their magnetic coupling and also to provide substantially identical coupling to an external magnetic field. The magnetic coupling between the first inductor 704 and the second inductor 706 is illustrated by a shared magnetic flux 708.

The first inductor 704 and the second inductor 706 are arranged to have the same polarity. The two inverters 304, 306 may correspond to any two non-neighbouring inverters in the quadrature oscillator circuit 600, such as the first inverter 602 and the third inverter 606, or the second inverter 604 and the fourth inverter 608. For example, the two inverters 304, 306 may correspond to the first inverter 602 and the third inverter 606, respectively. In this case the first capacitor 308 may correspond to the first capacitor $C_1$ and the second capacitor 310 may correspond to the third capacitor $C_3$; and the first inductor 704 may correspond to the first inductor 618 and the second inductor 706 may correspond to the third inductor 622.

Alternatively, the two inverters 304, 306 may correspond to the second inverter 604 and the fourth inverter 608, respectively. The first capacitor 308 may correspond to the second capacitor $C_2$ and the second capacitor 310 may correspond to the fourth capacitor $C_4$ of the quadrature oscillator circuit 600. The first inductor 704 may correspond to the second inductor 620 and the second inductor 706 may correspond to the fourth inductor 624 of the quadrature oscillator circuit 600.

Additionally, more than one oscillator circuit component 700 may be implemented in the quadrature oscillator circuit 600.

FIG. 8(A) is a schematic of an inductor arrangement 800 where a terminal of the first inductor 704 and a terminal of the second inductor 706 are grounded; and FIG. 8(b) is a schematic of an inductor arrangement 802 where a terminal of the first inductor 704 is coupled to a terminal of the second inductor 706. Common features between the inductor arrangements 800, 802 and the inductor arrangement 702 are represented by common reference numerals and variables. The inductor arrangements 800, 802 represent alternative configurations of the inductor arrangement 702 of FIG. 7.

FIG. 8(C) is a schematic of an inductor arrangement 804 comprising a first inductor 806 and a second inductor 808. This is in effect a modification of the inductor arrangements 800, 802 where the second inductor 706 has been flipped and is enclosed within the first inductor 704. The inductor arrangement 804 has a greater effective inductance due to increased magnetic coupling between the first inductor 806 and the second inductor 808 when compared to the inductor arrangements 800, 802. A centre tap may be added to ground a point of the inductor arrangement 804. Additionally, the inductor arrangement 804 enables use of a short length of wire, such as copper wire, and consequently exhibits a low resistance. However, as the second inductor 808 has been flipped, the inductor arrangement 804 is susceptible to the influence of external magnetic fields.

FIG. 9(A) is a further schematic of the inductor arrangement 802 and FIG. 9(B) is a further schematic of the inductor arrangement 804, illustrating the impact of an external magnetic field 900.

The external magnetic field 900 induces a first current I1 in the first inductor 704 and induces a second current I2 in the second inductor 706. The direction of each of the currents I1, I2 is illustrated by the arrows on the first inductor 704 and the second inductor 706. It will be appreciated that induced currents, such as the first current I1 and the second current I2 will contribute to any current already flowing through the inductor arrangement 802 during normal operation of a circuit of which it is a component.

The external magnetic field 900 induces a third current I3 in the first inductor 806 and induces a fourth current I4 in the second inductor 808. The direction of each of the currents I3, I4 is illustrated by the arrows on the first inductor 806 and the second inductor 808.

The inductor arrangement 802 is a differential structure as when both the first inductor 704 and the second inductor 706 are subject to the same external magnetic field, the sum of the first current I1 and the second current I2 is approximately zero. In this case, the currents I1, I2 generated by the external magnetic field 900 are substantially cancelled, and the inductor arrangement 802 is substantially insensitive to the external magnetic field. This is also the case for the inductor arrangement 402, the figure-8 inductor 500, the inductor arrangement 702 and the inductor arrangement 800.

In the inductor arrangement 804, the currents I3, I4 do not cancel, such that the external magnetic field 900 will generate a non-zero contribution at the outputs 902 of the inductor arrangement 804.

The inductors 704, 706 may be symmetric, in that each of the inductors 704, 706 are structurally similar, with an axis of symmetry between them, as is the case in the inductor arrangement 802. Each of the inductors 704, 706 of the inductor arrangement 802 forms a rounded rectangular shape with a width 904 and a length 906, where the length 906 is greater than the width 904. The lengths 906 of each of the inductors 704, 706 are adjacent, which provides greater magnetic coupling between the inductors 704, 706 and therefore greater effective inductance for the same area when compared to the inductors 704, 706 having, for example, a square shape where the width 904 and length 906 are equal.

Additionally, the rounded rectangular shape enables a second inductor arrangement, of the type of the inductor arrangement 802, to be positioned above or below a first inductor arrangement, of the type of the inductor arrangement 802, whilst occupying the same area on the chip.

FIG. 10(A) shows a schematic of an inductor arrangement 1000 in accordance with a second embodiment of this disclosure. The inductor arrangement 1000 comprises a first inductor structure 1002 at least partially on a first layer and a second inductor structure 1004 at least partially on a second layer. The first and second inductor structures 1002, 1004 each comprise one or more inductors. The first inductor structure 1002 comprises a first inductor 1006 and a second inductor 1008; and the second inductor structure 1004 comprises a third inductor 1010 and a fourth inductor 1012. FIG. 10(B) is a schematic of the first inductor structure 1002, and FIG. 10(C) is a schematic of the second inductor structure 1004.

The inductor arrangement 1000 may be implemented on a chip. The following description will relate to such an implementation, however it will be appreciated that the inductor arrangement 1000 may be implemented in other ways, for example as an independent and standalone structure or on a printed circuit board (PCB). The second inductor structure 1004 is positioned above or below the first inductor structure 1002 as illustrated in FIG. 10(A) such that they extend over approximately the same area on the chip. The first inductor structure 1002 is on the first layer and the second inductor structure 1004 is on the second layer where the first layer is at a distance from the second layer. The first layer is at a first depth with respect to a surface plane of the chip and the second layer is at a second depth with respect to the surface plane of the chip. The reference numerals for the first and second inductor structures 1002, 1004 have been omitted from FIG. 10(A) as it may reduce clarity of the schematic. However, the first, second, third and fourth inductors 1006, 1008, 1010, 1012 are labelled, such that it will be clear how the first and second inductor structures 1002, 1004 are arranged.

The, or each, inductor of one inductor structure overlaps, at least partially, the, or each, inductor of the other inductor structure. For example, for the inductor arrangement 1000, each of the first inductor 1006 and the second inductor 1008 overlap and are overlapped by the third inductor 1010 and the fourth inductor 1012.

It should be noted that the term "area" in reference to the chip area in this disclosure is in reference to an area extending over a surface of the chip. Therefore, as the first inductor structure 1002 is located substantially directly below or above the second inductor structure 1004 and they are of approximately the same size, it may be said that the first inductor structure 1002 on its own occupies approximately the same area as the inductor arrangement 1000 that comprises both the first inductor structure 1002 and the second inductor structure 1004. Consequently, arranging the inductor structures 1002, 1004 in this way enables a smaller area to be used to implement the two inductor structures 1002, 1004, when compared to, for example, the two inductor structures 1002, 1004 being arranged side by side on a single layer.

The inductors 1006, 1008, 1010, 1012 may be arranged such that at least one of the inductor structures 1002, 1004 is a differential structure so that induced currents and therefore the effect of external magnetic fields are cancelled. They may, for example be implemented using the inductor arrangements 702, 800, 802 as described previously, and as will be evident to the person skilled in the art.

In the following description "external" and "generated" magnetic fields will be referenced. The external magnetic field is as previously defined in this disclosure. A generated magnetic field is the magnetic field that is generated due to current flowing through an inductor. It will be appreciated that a magnetic field generated by an inductor may contribute to the external magnetic field that is received by another circuit component, such as another inductor.

To distinguish between an induced current, resulting from the external magnetic field, the current flow from normal operation of the circuit will be referred to as an operational current. It is desirable to reduce or cancel induced currents whilst maintaining the operational current.

When subject to an external magnetic field a first current IA is induced in the first inductor 1006 and a second current IB is induced in the second inductor 1008. As the first inductor structure 1002 is a differential structure, the sum of the first current IA and the second current IB is approximately zero. Therefore, the first current IA and the second current IB generated by the external magnetic field substantially cancel each other out, and the first inductor structure 1002 is substantially insensitive to the external magnetic field.

When subject to the external magnetic field a third current IC is induced in the third inductor 1010 and a fourth current ID is induced in the fourth inductor 1012. As the second inductor structure 1004 is a differential structure, the sum of the third current IC and the fourth current ID is approximately zero. Therefore, the third current IC and the fourth current ID generated by the external magnetic field substantially cancel each other out, and the second inductor structure 1004 is substantially insensitive to the external magnetic field.

When an operational current flows through the first inductor 1006, a first generated magnetic field is generated, and the third inductor 1010 and the fourth inductor 1012 are subjected to the first generated magnetic field. The first generated magnetic field contributes to the external magnetic field, such that the first generated magnetic field will contribute to the generation the third current IC and the fourth current ID, which will substantially cancel each other out. Consequently, the second inductor structure 1004 is substantially insensitive to the first generated magnetic field.

When the operational current flows through the second inductor 1008, a second generated magnetic field is generated and the third inductor 1010 and the fourth inductor 1012 are subjected to the second generated magnetic field. The second generated magnetic field contributes to the external magnetic field, such that the second generated magnetic field will contribute to the generation of the third current IC and the fourth current ID, which will substantially cancel each other out. Consequently, the second inductor structure 1004 is substantially insensitive to the second generated magnetic field.

When the operational current flows through the third inductor 1010, a third generated magnetic field is generated and the first inductor 1006 and the second inductor 1008 are subjected to the third generated magnetic field. The third generated magnetic field contributes to the external magnetic field, such that the third generated magnetic field will contribute to the generation of the first current IA and the second current IB, which will substantially cancel each other out. Consequently, the first inductor structure 1002 is substantially insensitive to the third generated magnetic field.

When the operational current flows through the fourth inductor 1012, a fourth generated magnetic field is generated and the first inductor 1006 and the second inductor 1008 are subjected to the fourth generated magnetic field. The fourth generated magnetic field contributes to the external magnetic field, such that the fourth generated magnetic field will contribute to the generation of the first current IA and the second current IB, which will substantially cancel each other out. Consequently, the first inductor structure 1002 is substantially insensitive to the fourth generated magnetic field.

When the operational current flows through both the first inductor 1006 and the second inductor 1008, the first generated magnetic field and the second generated magnetic field are approximately equal and with an opposite orientation, for example the first generated magnetic field may have a first direction, and may be referred to as positive, and the second generated magnetic field may have a second direction, where the second direction is opposite to that of the first, and therefore may be referred to as negative. Consequently, the first generated magnetic field and the second generated magnetic field will substantially cancel each other out, neither will contribute to the external magnetic field, and therefore neither will contribute to the generation of the third current IC and the fourth current ID. In this case there is no magnetic coupling between the first inductor structure 1002 and the second inductor structure 1004.

When the operational current flows through both the third inductor 1010 and the fourth inductor 1012, the third generated magnetic field and the fourth generated magnetic field are approximately equal and with an opposite orientation. Consequently, the third generated magnetic field and the fourth generated magnetic field will substantially cancel each other out, and neither will contribute to the external magnetic field, and therefore neither will contribute to the generation of the first current IA and the fourth current IB. In this case there is no magnetic coupling between the first inductor structure 1002 and the second inductor structure 1004.

The inductor arrangement 1000 illustrated in FIG. 10(A) shows the two inductor structures 1002,1004 extending over approximately the same area. It will be appreciated that this is not an essential feature, for example the second inductor structure 1004 may enclose a smaller area than the first inductor structure 1002 and the inductor arrangement 1000 would operate substantially as described previously. It is desirable to have an inductor, placed above or below an inductor pair, to provide its generated magnetic field approximately equally to both inductors of the pair to ensure that the induced currents are cancelled, however a degree of induced current cancellation is still possible if the generated magnetic field is provided to each of the inductors of the inductor pair unequally. For example, the third inductor 1010 is positioned to provide the third generated magnetic field approximately equally to the first inductor 1006 and the second inductor 1008, however if the third inductor 1010 is offset such that the third generated magnetic field is provided unequally to the inductors 1006,1008 then the induced currents may be partially cancelled.

It will be appreciated that it is possible to omit one of the four inductors 1006, 1008, 1010, 1012 from the inductor arrangement 1000, for example the fourth inductor 1012. In this case, the second inductor structure 1004 is no longer a differential structure and therefore will be susceptible to the influence of an external magnetic field. In this case, there will be provided an area efficient inductor arrangement comprising three inductors.

From FIGS. 10(A), (B), (C) it can be seen that the first inductor structure 1002 is structurally similar to the second inductor structure 1004, but is rotated by 90° with respect to the first inductor structure 1002. Each of the inductor structures 1002, 1004 are substantially symmetric. The first inductor structure 1002 is substantially symmetric and comprises a first axis of symmetry between the first inductor 1006 and the second inductor 1008; and the second inductor structure 1004 is substantially symmetric and comprises a second axis of symmetry between the third inductor 1010 and the fourth inductor 1012. The first axis of symmetry is approximately perpendicular to the second axis of symmetry. The symmetry of the inductor structures 1002, 1004 and their rotated orientation with respect to each other prevents magnetic coupling between the inductor structures 1002, 1004.

It can be observed that the first inductor 1006 and the second inductor 1008 are adjacent; and the third inductor 1010 and the fourth inductor 1012 are adjacent. The four inductors 1006, 1008, 1010, 1012 are substantially rectangular in shape; they each comprise two terminals and have rounded edges. Each of the four inductors 1006, 1008, 1010, 1012 comprises a width 1014 and a length 1016, as illustrated in FIG. 10(B) for the first inductor 1006 where the length 1016 is longer than the width 1014.

The location of the terminals may be designed based on the location of other components in the physical implementation of the circuit, as long as their arrangement does not substantially impact the structural requirements of the inductor arrangement 1000.

The length of the first inductor 1006 is adjacent to the length of the second inductor 1008. The length of the third inductor 1010 is adjacent to the length of the fourth inductor 1012. Using the arrangement presented in FIGS. 10(A), (B) and (C), both inductor structures 1002, 1004 extend over approximately the same area on the chip.

It will be appreciated that different inductor shapes may be used. FIG. 11(A) shows a schematic of an inductor arrangement 1100 in accordance with a third embodiment of this disclosure. The inductor arrangement 1100 comprises a first inductor structure 1102 on a first layer and a second inductor structure 1104 on a second layer. The first and second inductor structures 1102, 1104 each comprise one or more inductors. The first inductor structure 1102 comprises a first inductor 1106 and a second inductor 1108; and the second inductor structure 1104 comprises a third inductor 1110 and a fourth inductor 1012. The second inductor structure 1104 is positioned above or below the first inductor structure 1102 as illustrated in FIG. 10(A) such that they extend over approximately the same area on the chip.

FIG. 11(B) is a schematic of the first inductor structure 1102, and FIG. 11(C) is a schematic of the second inductor structure 1104.

Each of the inductors 1106, 1108, 1110, 1112 comprise terminals and coupling between the first inductor 1106 and the second inductor 1108; and coupling between the third inductor 1110 and the fourth inductor 1112 to form differential structures. Note that the coupling is not illustrated in FIG. 11. As for the inductor arrangement 1000, the location of the terminals may be designed based on the location of other components in the physical implementation of the circuit, as long as their arrangement does not substantially impact the structural requirements of the inductor arrangement 1000. The operation of the inductor arrangement 1100 is substantially the same as the operation of the inductor arrangement 1000, as will be clear to the skilled person.

It can be observed that the first inductor 1106 and the second inductor 1108 are adjacent; and the third inductor 1110 and the fourth inductor 1112 are adjacent. The four inductors 1106, 1108, 1110, 1112 are substantially triangular in shape. Each of the four inductors 1106, 1108, 1110, 1112 comprises a width 1114, a length 1116 and a height 1118, as illustrated in FIG. 11(B) for the first inductor 1106 where the length 1116 is longer than each of the width 1114 and the height 1118.

The length of the first inductor 1106 is adjacent to the length of the second inductor 1108. The length of the third inductor 1110 is adjacent to the length of the fourth inductor 1112. Using the arrangement presented in FIGS. 11(A), (B) and (C), both inductor structures 1102, 1104 extend over approximately the same area on the chip.

Figure 12B:
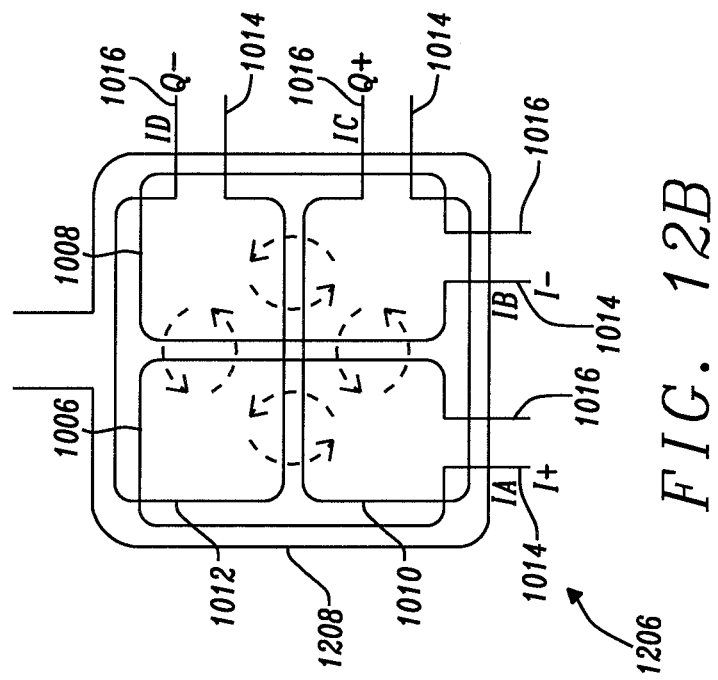
FIGS. 12(A) and 12(B) are a schematic of inductor arrangements in accordance with fourth and fifth embodiments of this disclosure, respectively.
Figure 12A:
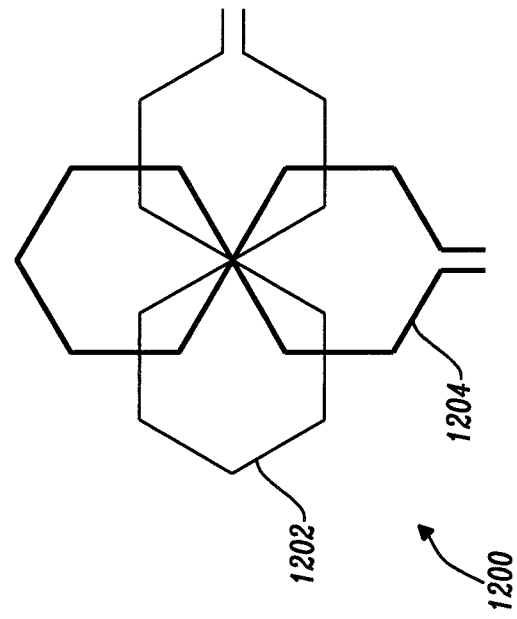

FIG. 12(A) shows a schematic of an inductor arrangement 1200 in accordance with a fourth embodiment of this disclosure. The inductor arrangement 1200 comprises a first inductor structure 1202 on a first layer and a second inductor structure 1204 on a second layer. The first and second inductor structures 1202, 1204 each comprise one or more inductors. Each of the inductor structures 1202, 1204 are figure-8 inductors as described in FIG. 5(A) and FIG. 5(B). The second inductor structure 1204 is positioned above or below the first inductor structure 1202 and is rotated by 90° with respect to the first inductor structure 1202. The operation of the inductor arrangement 1200 will be evident to the skilled person based on the description provided for the previous inductor arrangements 1000, 1100.

Each of the inductor arrangements 1000, 1100, 1200 may be implemented in a quadrature oscillator circuit, for example the quadrature oscillator circuit 600 as is shown in FIG. 6. In consideration of the inductor arrangement 1000, the first inductor 1006 and the second inductor 1008 are arranged to have the same polarity; and the third inductor 1010 and the fourth inductor 1014 are arranged to have the same polarity. The first inductor 1006 may correspond to the first inductor 618; the second inductor 1008 may correspond to the third inductor 622; the third inductor 1010 may correspond to the second inductor 620; and the fourth inductor 1012 may correspond to the fourth inductor 624. Each of the inductors 1006, 1008, 1010, 1012 comprises an inverter output terminal 1014 for coupling to the output of an inverter; and a load capacitor terminal 1016 for coupling to the appropriate capacitor.

Each first and second inductors 1006, 1008 may correspond to any two non-neighbouring inductors of the quadrature oscillator circuit 600; and each of the third and fourth inductors 1010, 1012 may correspond to any two non-neighbouring inductors of the quadrature oscillator circuit 600. It is necessary that each of the inductors structures 1002, 1004 comprise two non-neighbouring inductors to ensure that there is a 180° phase difference between inductors to ensure that the external magnetic field cancels.

Based on the above description of how the inductor arrangement 1000 could be implemented in the quadrature oscillator circuit 600, it will be clear to the skilled person how the inductor arrangements 1100, 1200 may be implemented in the quadrature oscillator circuit 600.

A fifth embodiment of this disclosure corresponds to any of the previously described inductor arrangements 1000, 1100, 1200, further comprising an independent inductor structure. FIG. 12(B) shows a schematic of an inductor arrangement 1206 in accordance with the fifth embodiment of this disclosure. The inductor arrangement 1206 comprises the inductor arrangement 1000, and an independent inductor 1208 that encloses the area occupied by the inductor arrangement 1000. The independent inductor may be positioned substantially on a third layer that is at a distance from the first and second layers, or alternatively may be positioned substantially on the first or the second layers.

FIGS. 13(A), (B), (C) show cross sections of an inductor arrangement 1300, an inductor arrangement 1302, and an inductor arrangement 1304, in accordance with a sixth, seventh and eighth embodiments of this disclosure, respectively. The inductor arrangements 1300, 1302, 1304 are insensitive to external magnetic fields. The inductor arrangements 1300, 1302, 1304 implement an additional four inductors compared to the previously described inductor arrangements, such as the inductor arrangement 1000.

The inductor arrangement 1300 comprises the inductor arrangement 1000, as previously described; a third inductor structure 1306 on a third layer, comprising a fifth inductor 1308 and a sixth inductor 1310; and a fourth inductor structure 1312 on the third layer comprising a seventh inductor 1314 and an eighth inductor 1316. Each of the third inductor structure 1306 and the fourth inductor structure 1312 overlaps the first inductor structure 1002 and the second inductor structure 1004.

The inductor arrangement 1302 comprises the inductor arrangement 1000, as previously described; a third inductor structure 1318 on a third layer, comprising a fifth inductor 1320 and a sixth inductor 1322; and a fourth inductor structure 1324 on the third layer comprising a seventh inductor 1326 and an eighth inductor 1328. Each of the third inductor structure 1318 and the fourth inductor structure 1324 overlaps the first inductor structure 1002 and the second inductor structure 1004.

It should be noted that the dashed lines illustrating the fourth inductor structure 1324 being enclosed within the third inductor structure 1318 are for illustrative purposes only; the fourth inductor structure 1324 is behind the third inductor structure 1318 in the cross-section view presented in FIG. 13(B).

The inductor arrangement 1304 comprises the inductor arrangement 1000, as previously described; a third inductor structure 1330 on a third layer, comprising a fifth inductor 1332 and a sixth inductor 1334; and a fourth inductor structure 1336 on the third layer comprising a seventh inductor 1338 and an eighth inductor 1340. Each of the third inductor structure 1330 and the fourth inductor structure 1336 overlaps the first inductor structure 1002 and the second inductor structure 1004.

FIG. 13(D) is a schematic of the third inductor structure 1306 and the fourth inductor structure 1312; FIG. 13(D) is a schematic of the third inductor structure 1318 and the fourth inductor structure 1324; and FIG. 13(E) is a schematic of the third inductor structure 1330 and the fourth inductor structure 1336.

Each of the third inductor structures 1306, 1318, 1330 and the fourth inductor structures 1312, 1324, 1336 are configured as figure-8 inductors as described in FIG. 5(A) and FIG. 5(B).

For the inductor arrangement 1300, the third inductor structure 1306 and the fourth inductor structure 1312 may be positioned above, below or between the first inductor structure 1002 and the second inductor structure 1004.

For the inductor arrangement 1302, the third inductor structure 1318 and the fourth inductor structure 1324 may be positioned above, below or between the first inductor structure 1002 and the second inductor structure 1004.

For the inductor arrangement 1304, the third inductor structure 1330 and the fourth inductor structure 1336 may be positioned above, below or between the first inductor structure 1002 and the second inductor structure 1004.

The third layer is at a third depth with respect to a surface plane of the chip.

For each of the third inductor structures 1306, 1318, 1330, when subject to the external magnetic field a fifth current is induced in the fifth inductor 1308, 1320, 1332 and a sixth current is induced in the sixth inductor 1310, 1322, 1334. As the third inductors structures 1306, 1318, 1330 are differential structures, the sum of their respective fifth currents and sixth currents are approximately zero. Therefore, the fifth currents and the sixth currents generated by the external magnetic field substantially cancel each other out, and the third inductor structures 1306, 1318, 1330 are substantially insensitive to the external magnetic field.

For each of the fourth inductor structures 1312, 1324, 1336, when subject to the external magnetic field a seventh current is induced in the seventh inductor 1314, 1326, 1338 and an eighth current is induced in the eighth inductor 1316, 1328, 1340. As the fourth inductors structures 1312, 1324, 1336 are differential structures, the sum of their respective seventh currents and eighth currents are approximately zero. Therefore, the seventh currents and the eighth currents generated by the external magnetic field substantially cancel each other out, and the fourth inductor structures 1312, 1324, 1336 are substantially insensitive to the external magnetic field.

For the inductor arrangement 1300, when an operational current flows through the fifth inductor 1308 and the sixth inductor 1310, a fifth generated magnetic field is generated, and a sixth generated magnetic field is generated. As the fifth and sixth generated magnetic fields are approximately equal and with opposite orientations with respect to each other, the fifth and sixth generated magnetic fields substantially cancel each other out.

For the inductor arrangement 1300, when the operational current flows through the seventh inductor 1314 and the eighth inductor 1316, a seventh generated magnetic field is generated, and an eighth generated magnetic field is generated. As the seventh and eighth generated magnetic fields are approximately equal and with opposite orientations with respect to each other, the seventh and eighth generated magnetic fields substantially cancel each other out.

For the inductor arrangement 1302, when an operational current flows through the fifth inductor 1320 and the sixth inductor 1322, a fifth generated magnetic field is generated, and a sixth generated magnetic field is generated. As the fifth and sixth generated magnetic fields are approximately equal and with opposite orientations with respect to each other, the fifth and sixth generated magnetic fields substantially cancel each other out.

For the inductor arrangement 1302, when the current flows through the seventh inductor 1326 and the eighth inductor 1328, a seventh generated magnetic field is generated, and an eighth generated magnetic field is generated. As the seventh and eighth generated magnetic fields are approximately equal and with opposite orientations with respect to each other, the seventh and eighth generated magnetic fields substantially cancel each other out.

The inductor arrangement 1304 operates in a similar fashion to the inductor arrangements 1300, 1302, as will be evident to the skilled person.

Each of the inductors shown in this disclosure have been presented as single loops. It will be appreciated that there are multiple alternative methods of implementing these inductors. For example, a spiral inductor or an interwind inductor.

FIG. 14A shows the first inductor 1006 as shown in FIG. 10. FIG. 14B shows an interwind inductor 1400 illustrating how the first inductor 1006 may be implemented as the interwind inductor 1400. A first portion 1402 of the interwind inductor 1400 is implemented on a first layer and at regions 1404, 1406 a second portion of the interwind inductor 1400 passes above or below the first portion.

Additionally, FIG. 14C shows in the exploded view the interwind inductor 1400 is implemented across multiple metal layers 1408, 1410 that are coupled using vias 1412. It will be appreciated that in further embodiments, multiple inductor loops may span multiple layers.

Figure 15:
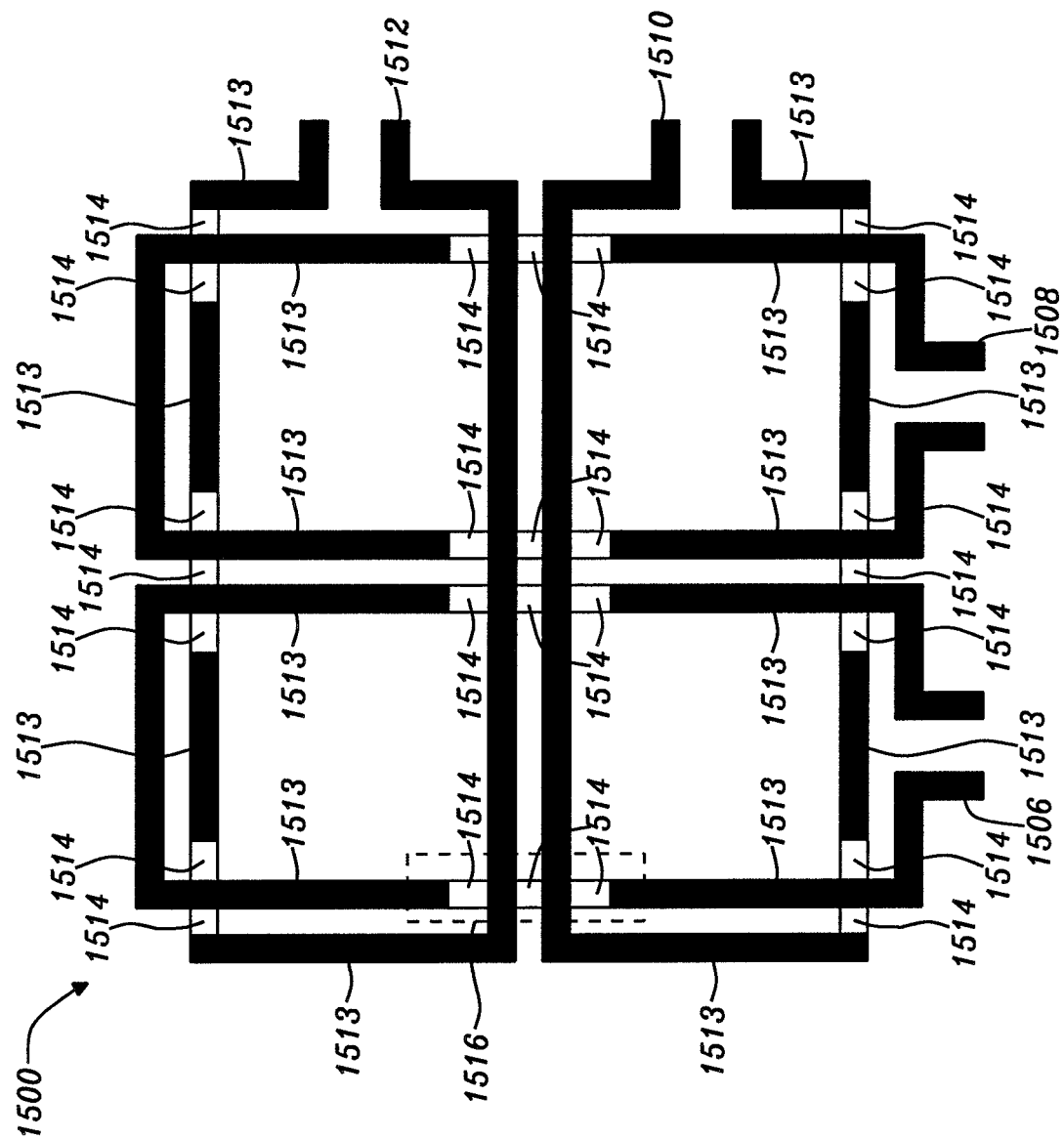
FIG. 15 is a schematic of an inductor arrangement in accordance with a ninth embodiment of this disclosure.

FIG. 15 shows a schematic of an inductor arrangement 1500 in accordance with a ninth embodiment of this disclosure. The inductor arrangement 1500 comprises a first inductor structure (1506+1508) partially on a first layer and a second inductor structure (1510+1512) partially on a second layer. The first inductor structure (1506+1508) and the second inductor structure (1510+1512) each comprise one or more inductors.

In this specific embodiment, the first inductor structure (1506+1508) comprises a first inductor 1506 and a second inductor 1508; and the second inductor structure (1510+1512) comprises a third inductor 1510 and a fourth inductor 1512. In this specific embodiment each of the inductor structures (1506+1508, 1510+1512) are mostly implemented in the first layer. By "mostly" it is meant that a greater portion of the inductor structures (1506+1508, 1510+1512) are implemented in the first layer than in any other layer, for example, the second layer.

Parts of the inductors on the first layer are denoted by the reference numeral 1513 and parts of the inductors on the second layer are denoted by the reference numeral 1514.

In this specific embodiment, the inductors of one inductor structure, passes underneath or above the inductors of the other inductor structure via the second layer. For example, a portion of the second inductor structure (1510+1512) passes above or below a portion of the first inductor structure (1506+1508) via the second layer. A portion of the first inductor structure (1506+1508) may also pass above or below a portion of the second inductor structure (1510+1512) via the second layer.

By way of example, in the present embodiment the inductor 1506 passes from the first layer to the second layer, passes above or below the inductors 1510, 1512, and passes back to the first layer, as is shown in a region 1516.

The inductor arrangement 1500 enables an inductor arrangement to be implemented mostly in a single layer, however the requirement for an inductor to pass below or above another inductor means that a second layer is also used for implementation. The inductor arrangement 1500 may also be referred to as being "interwind".

The inductor arrangement 1500 operates substantially as described for the inductor arrangement 1000 as will be evident to the skilled person. It will be appreciated that in further embodiments, an inductor arrangement may comprise inductors passing above and/or below each other via one or more different layers.

It will be appreciated that any of the inductor arrangements as described previously may be implemented mostly in a single layer as described for the inductor arrangement 1500, or in multiple layers, in accordance with the understanding of the skilled person. Multiple layers may be used to increase the Q factor of the inductor.

It will be appreciated that none, one or all inductors in each of the inductor arrangements presented may be implemented using different inductor types, such as a spiral inductor or an interwind inductor, such as the interwind inductor 1400.

Figure 16A:
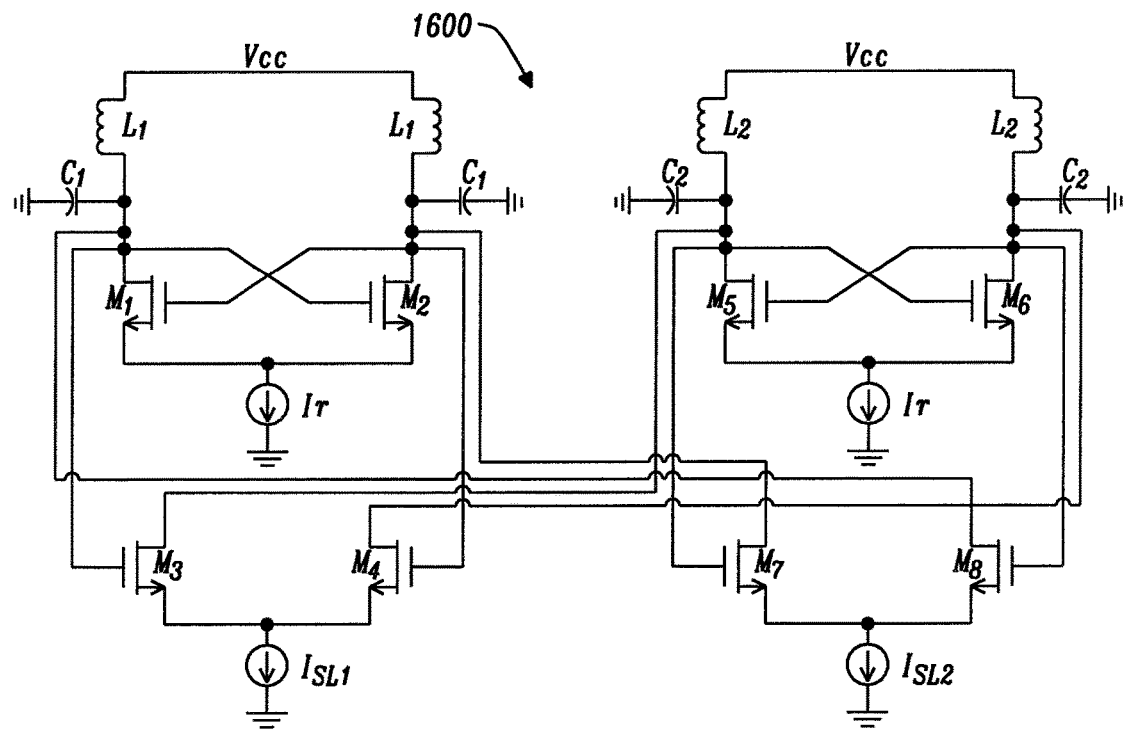
FIGS. 16A and 16B show schematics of two oscillator circuits.
Figure 16B:
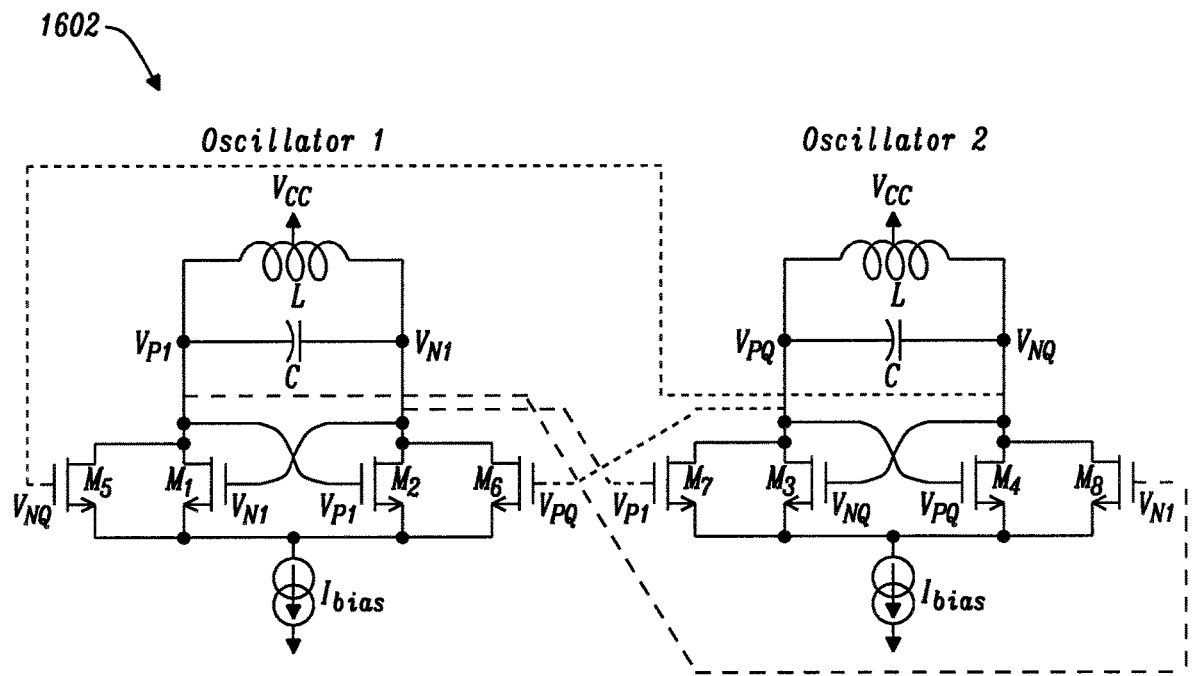

FIGS. 16A and 16B show two alternative oscillator circuits 1600, 1602 suitable for implementation of the inductor arrangements of this disclosure.

The inductor arrangements presented in this disclosure comprise area efficient arrangements of the inductor structures, thereby saving chip area. Additionally, the inductor structures are differential structures and therefore insensitive to external magnetic fields; and the arrangement of the inductor structures with respect to each other prevents magnetic coupling between inductor structures, when operated substantially as described herein.

Due to the reduction in magnetic coupling and therefore magnetic frequency pulling, a quadrature oscillator circuit implementing one of the disclosed inductor arrangements will not require operation of the oscillator circuit at twice the frequency. Additionally, it will not be necessary to implement frequency dividers. Consequently, the power consumption of the oscillator circuit will be reduced.

One application of the inductor arrangement described in this disclosure is for use in an oscillator circuit, specifically a quadrature oscillator circuit, however it will be appreciated that the inductor arrangement will also be suitable for other applications in accordance with the understanding of the skilled person.

Various improvements and modifications may be made to the above without departing from the scope of the disclosure.

What is claimed is:

1. An inductor arrangement, comprising:
a first inductor structure comprising one or more inductors at least partially on a first layer; and
a second inductor structure comprising one or more inductors at least partially on a second layer; wherein
the inductors are arranged such that currents induced by an external magnetic field are substantially cancelled in at least one of the first inductor structure and the second inductor structure; and
the, or each, inductor of the second inductor structure overlaps, at least partially, the, or each, inductor of the first inductor structure.

2. The inductor arrangement of claim 1, wherein a portion of the second inductor structure passes above or below a portion of the first inductor structure via the second layer.

3. The inductor arrangement of claim 1, wherein:
the first layer is at a first depth with respect to a surface of a chip; and
the second layer is at a second depth with respect to the surface of the chip.

4. The inductor arrangement of claim 1, wherein the first inductor structure comprises a first inductor and a second inductor that are coupled such that currents induced in the first inductor structure by the external magnetic field are substantially cancelled.

5. The inductor arrangement of claim 4, wherein:
the first inductor is arranged to generate a first generated magnetic field and the second inductor is arranged to generate a second generated magnetic field when an operational current flows through the first and second inductors; and
the first and second generated magnetic fields are approximately equal and with opposite orientations such that they substantially cancel each other out.

6. The inductor arrangement of claim 4, wherein the first inductor structure is substantially symmetric and comprises a first axis of symmetry between the first inductor and the second inductor.

7. The inductor arrangement of claim 4, wherein the first inductor and the second inductor are adjacent.

8. The inductor arrangement of claim 4, wherein:
the first inductor and the second inductor are substantially rectangular in shape, such that each inductor comprises a width and a length, the length being longer than the width.

9. The inductor arrangement of claim 4, wherein:
the first inductor and the second inductor are substantially triangular in shape, such that each inductor comprises a width, a height and a length, the length being longer than each of the width and the height.

10. The inductor arrangement of claim 4, wherein the second inductor structure comprises a third inductor.

11. The inductor arrangement of claim 10, wherein the third inductor is arranged to generate a third generated magnetic field, the third generated magnetic field contributing to the external magnetic field provided to the first inductor structure.

12. The inductor arrangement of claim 10, wherein the second inductor structure comprises a fourth inductor, the third inductor and the fourth inductor are coupled such that currents induced in the second inductor structure by the external magnetic field are substantially cancelled.

13. The inductor arrangement of claim 12, wherein:
the first inductor is arranged to generate a first generated magnetic field and the second inductor is arranged to generate a second generated magnetic field when an operational current flows through the first and second inductors;
the first and second generated magnetic fields are approximately equal and with opposite orientations such that they substantially cancel each other out;
the third inductor is arranged to generate a third generated magnetic field and the fourth inductor is arranged to generate a fourth generated magnetic field when the operational current flows through the third and fourth inductors; and
the third and fourth generated magnetic fields are approximately equal and with opposite orientations such that they substantially cancel each other out.

14. The inductor arrangement of claim 1 comprising:
a third inductor structure comprising one or more inductors at least partially on a third layer, wherein the third inductor structure overlaps, at least partially, the first inductor structure and the second inductor structure.

15. The inductor arrangement of claim 14, comprising:
a fourth inductor structure comprising one or more inductors at least partially on the third layer, wherein the fourth inductor structure overlaps, at least partially, the first inductor structure and the second inductor structure.

16. An oscillator circuit comprising an inductor arrangement, the inductor arrangement comprising:
a first inductor structure comprising one or more inductors at least partially on a first layer; and
a second inductor structure comprising one or more inductors at least partially on a second layer; wherein
the inductors are arranged such that currents induced by an external magnetic field are substantially cancelled in at least one of the first inductor structure and the second inductor structure; and
the, or each, inductor of the second inductor structure overlaps, at least partially, the, or each, inductor of the first inductor structure.

17. The oscillator circuit of claim 16 comprising a plurality of inverters.

18. An oscillator circuit comprising
a plurality of inductors, wherein each inductor is of opposite polarity to its neighboring inductors; and
a plurality of inverters, wherein each inverter is coupled to a next inverter via an inductor.

19. The oscillator circuit of claim 18 arranged as a quadrature oscillator circuit, wherein:
the plurality of inverters comprises a first, second, third and fourth inverter;
the plurality of inductors comprises a first, second, third and fourth inductor;
the first inverter is coupled to the second inverter via the first inductor;
the second inverter is coupled to the third inverter via the second inductor;
the third inverter is coupled to the fourth inverter via the third inductor;
the fourth inverter is coupled to the first inverter via the fourth inductor; and
the first inductor and the third inductor have the same polarity and are of opposite polarity to that of the second inductor and the fourth inductor.

20. A method of providing an inductor arrangement, comprising the steps of:
providing a first inductor structure comprising one or more inductors at least partially on a first layer; and
providing a second inductor structure comprising one or more inductors at least partially on a second layer; wherein
the inductors are arranged such that currents induced by an external magnetic field are substantially cancelled in at least one of the first inductor structure and the second inductor structure; and
the, or each, inductor of the second inductor structure overlaps, at least partially, the, or each, inductor of the first inductor structure.

21. A method of providing an oscillator circuit comprised of an inductor arrangement, comprising the steps of:
providing a first inductor structure comprising one or more inductors at least partially on a first layer; and providing a second inductor structure comprising one or more inductors at least partially on a second layer; wherein the inductors are arranged such that currents induced by an external magnetic field are substantially cancelled in at least one of the first inductor structure and the second inductor structure; and the, or each, inductor of the second inductor structure overlaps, at least partially, the, or each, inductor of the first inductor structure.

* * * * *